US010990311B2

(12) United States Patent
Saxena et al.

(10) Patent No.: US 10,990,311 B2
(45) Date of Patent: Apr. 27, 2021

(54) MULTI-STREAM NON-VOLATILE STORAGE SYSTEM

(71) Applicant: WESTERN DIGITAL TECHNOLOGIES, INC., San Jose, CA (US)

(72) Inventors: Vishwas Saxena, Bangalore (IN); Abhijit Rao, Bangalore (IN); Ravi Kumar, Bangalore (IN); Saifullah Nalatwad, Bangalore (IN)

(73) Assignee: Western Digital Technologies, Inc., San Jose, CA (US)

( * ) Notice: Subject to any disclaimer, the term of this patent is extended or adjusted under 35 U.S.C. 154(b) by 16 days.

(21) Appl. No.: 16/445,498

(22) Filed: Jun. 19, 2019

(65) Prior Publication Data

US 2020/0401334 A1    Dec. 24, 2020

(51) Int. Cl.
*G06F 12/02* (2006.01)
*G06F 3/06* (2006.01)
*G11C 29/52* (2006.01)
*G06F 12/10* (2016.01)
*G06F 12/0804* (2016.01)
*G06F 11/10* (2006.01)

(52) U.S. Cl.
CPC .......... *G06F 3/0644* (2013.01); *G06F 3/0604* (2013.01); *G06F 3/0659* (2013.01); *G06F 3/0679* (2013.01); *G06F 11/1068* (2013.01); *G06F 12/0804* (2013.01); *G06F 12/10* (2013.01); *G11C 29/52* (2013.01); *G06F 12/0246* (2013.01); *G06F 2212/608* (2013.01); *G06F 2212/657* (2013.01)

(58) Field of Classification Search
None
See application file for complete search history.

(56) References Cited

U.S. PATENT DOCUMENTS 8,046,523 B2    10/2011   Hwang et al.
9,070,479 B2 *   6/2015   Sharon .................. G11C 29/04
(Continued)

OTHER PUBLICATIONS

Chang, Yuan-Hao, et al., "An Adaptive File-System-Oriented FTL Mechanism for Flash-Memory Storage Systems," ACM Transactions on Embedded Computing Systems, vol. 11, No. 1, Article 9, Mar. 2012, 19 pages.

(Continued)

*Primary Examiner* — Brian R Peugh
(74) *Attorney, Agent, or Firm* — Vierra Magen Marcus LLP

(57) ABSTRACT

A non-volatile storage apparatus (e.g., an SSD, embedded memory, memory card, etc.) comprises non-volatile memory (e.g., one or more memory dies) connected to a control circuit (e.g., controller, state machine, microcontroller, etc.). The non-volatile memory is configured to have multiple regions for storing different types of data using separate streams. The control circuit is configured to receive a request to write data to a logical address, automatically choose a stream (and corresponding destination region) by determining which of the multiple regions/streams has a sequence of logical addresses associated with previous writes that best fits the logical address for the received data, and store the received data in the chosen destination region of the non-volatile memory using the chosen stream.

19 Claims, 15 Drawing Sheets

(56) References Cited

U.S. PATENT DOCUMENTS

| | | |
|---|---|---|
| 9,891,838 B2 | 2/2018 | Woo et al. |
| 9,921,954 B1 | 3/2018 | Sabbag et al. |
| 2016/0019136 A1* | 1/2016 | Nellans ............. G11C 11/40607 |
| | | 711/102 |
| 2018/0239547 A1 | 8/2018 | Inbar et al. |
| 2020/0201557 A1* | 6/2020 | Jeong ................... G06F 3/0659 |

OTHER PUBLICATIONS

Lim, Seung-Ho, "Virtually Separable Block Management in Flash Storage System," International Journal of Multimedia and Ubiquitous Engineering, vol. 9, No. 9, Oct. 2014, pp. 299-310.

\* cited by examiner

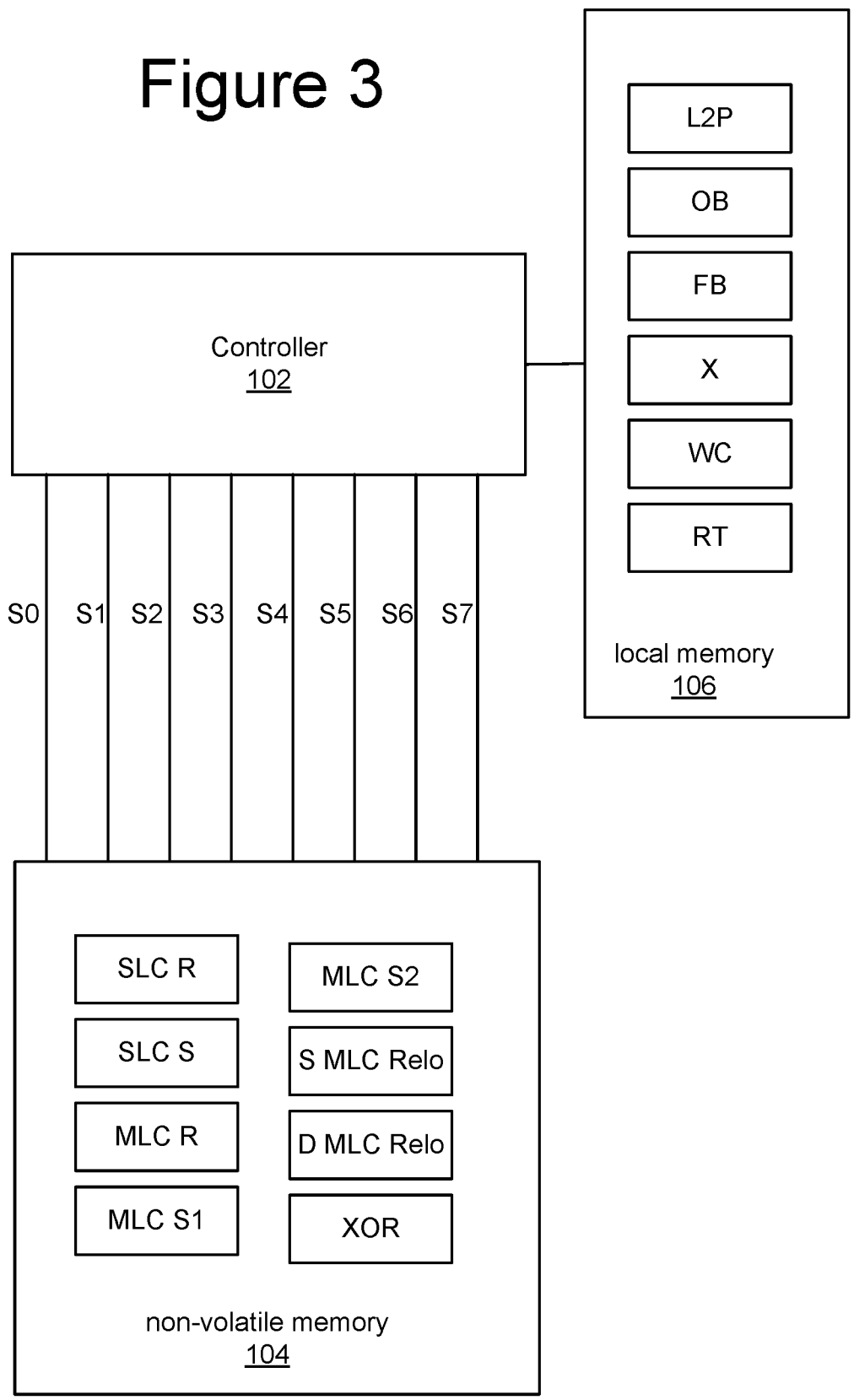

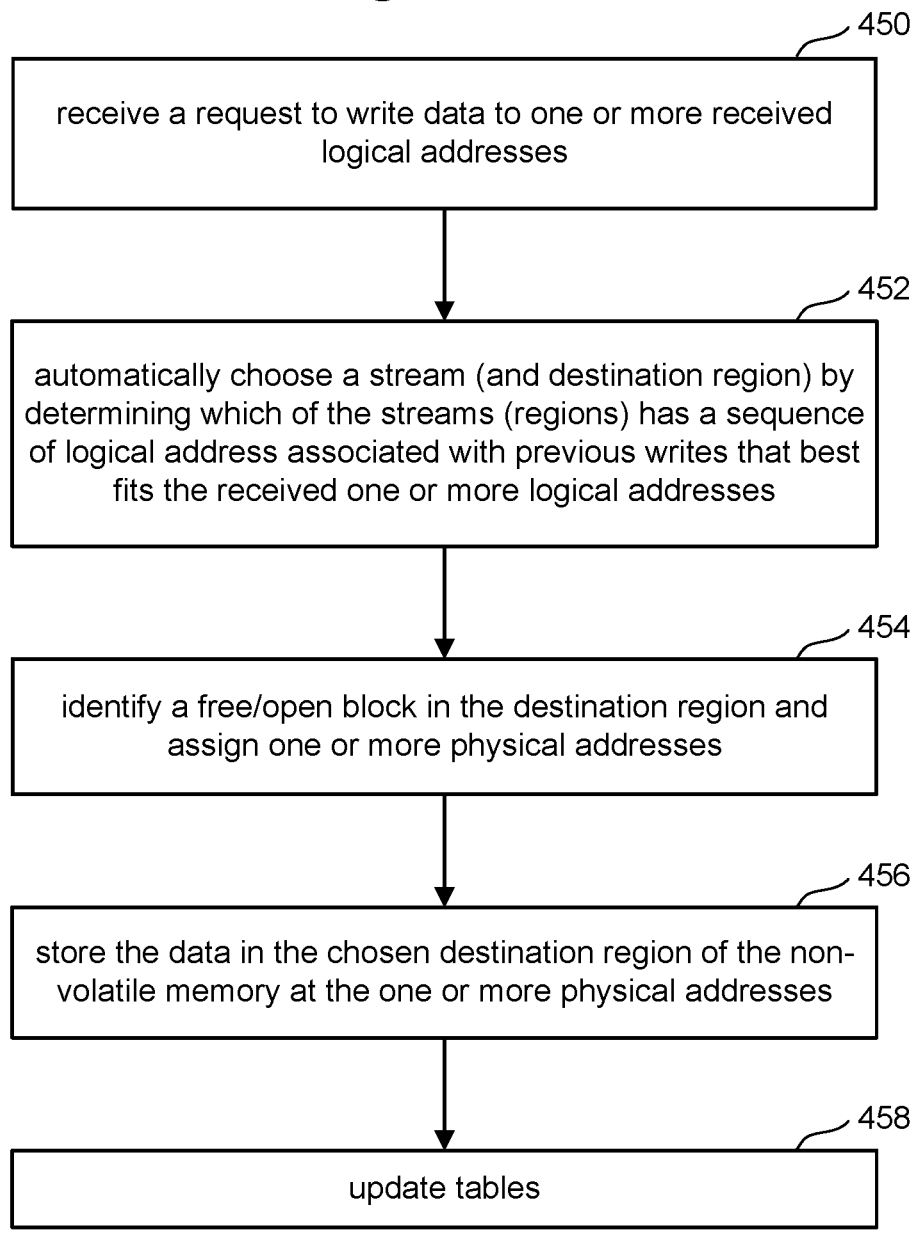

Figure 7A

| Pattern | Start-LBA | End-LBA | Stream (Region) to route | Timestamp |
|---|---|---|---|---|
| 1 | 101 | 300 | 1 | t1 |
| 2 | 201 | 400 | 2 | t2 |
| 3 | 301 | 500 | 1 | t3 |
| 4 | 401 | 600 | 2 | t4 |
| 5 | 501 | 700 | 1 | t5 |
| 6 | 601 | 800 | ? | t6 |

Figure 7B

| Pattern | Start-LBA | End-LBA | Stream (Region) to route | Timestamp |
|---|---|---|---|---|
| 1 | 101 | 300 | 1 | t1 |
| 2 | 201 | 400 | 2 | t2 |
| 3 | 301 | 500 | 1 | t3 |
| 4 | 401 | 600 | 2 | t4 |
| 5 | 501 | 700 | 1 | t5 |
| 6 | 601 | 800 | 2 | t6 |
| 7 | 901 | 1100 | ? | t7 |

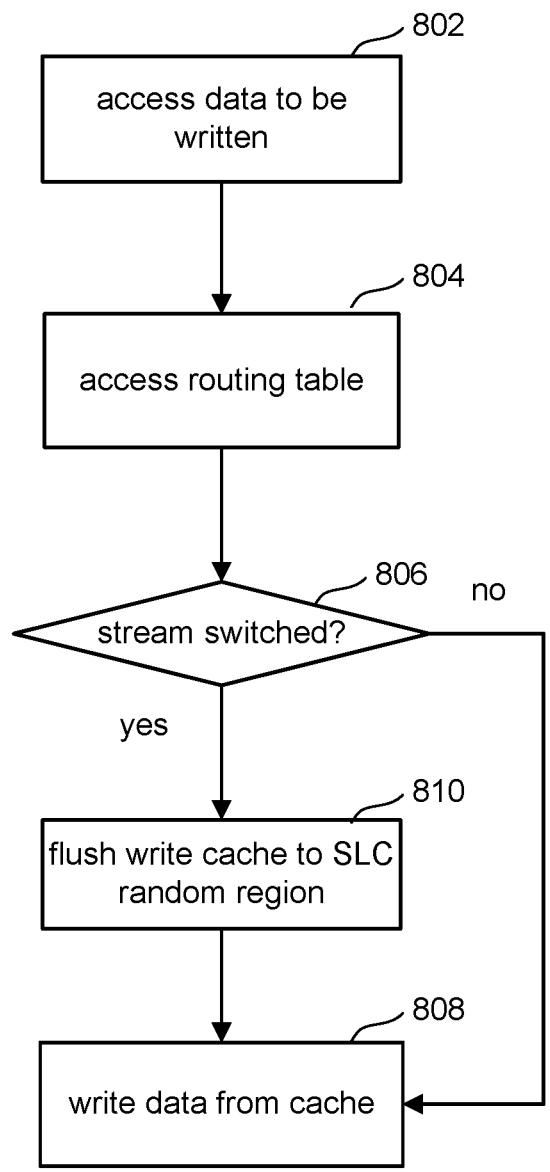

MULTI-STREAM NON-VOLATILE STORAGE SYSTEM

BACKGROUND

Many electronic devices make use of an embedded or otherwise connected memory. Often, the embedded or connected memory includes non-volatile memory. An electronic device that includes an embedded memory or is connected to an external memory is referred to as a host. Examples of host systems include smartphones, laptops, desktop computers, servers, smart appliances, digital cameras, video cameras, etc.

A non-volatile memory allows information to be stored and retained even when the non-volatile memory is not connected to a source of power (e.g., a battery). Examples of non-volatile memory include flash memory (e.g., NAND-type and NOR-type flash memory), Electrically Erasable Programmable Read-Only Memory (EEPROM), and others. One example of a memory device that uses semiconductor based non-volatile memory is a solid state drive.

Non-volatile memory has become more popular and is now being used with more applications. For example, non-volatile memory is being used to store media, such as images, audio and/or video. When used to store media from a sensor (e.g., still camera, video camera, audio recorder), write performance is important to the user. For example, it is not desirable to require a camera to pause recording due to a slow memory.

BRIEF DESCRIPTION OF THE DRAWINGS

Like-numbered elements refer to common components in the different figures.

In some embodiments, the Back End Processor Circuit is part of a controller.

Figure 1A:
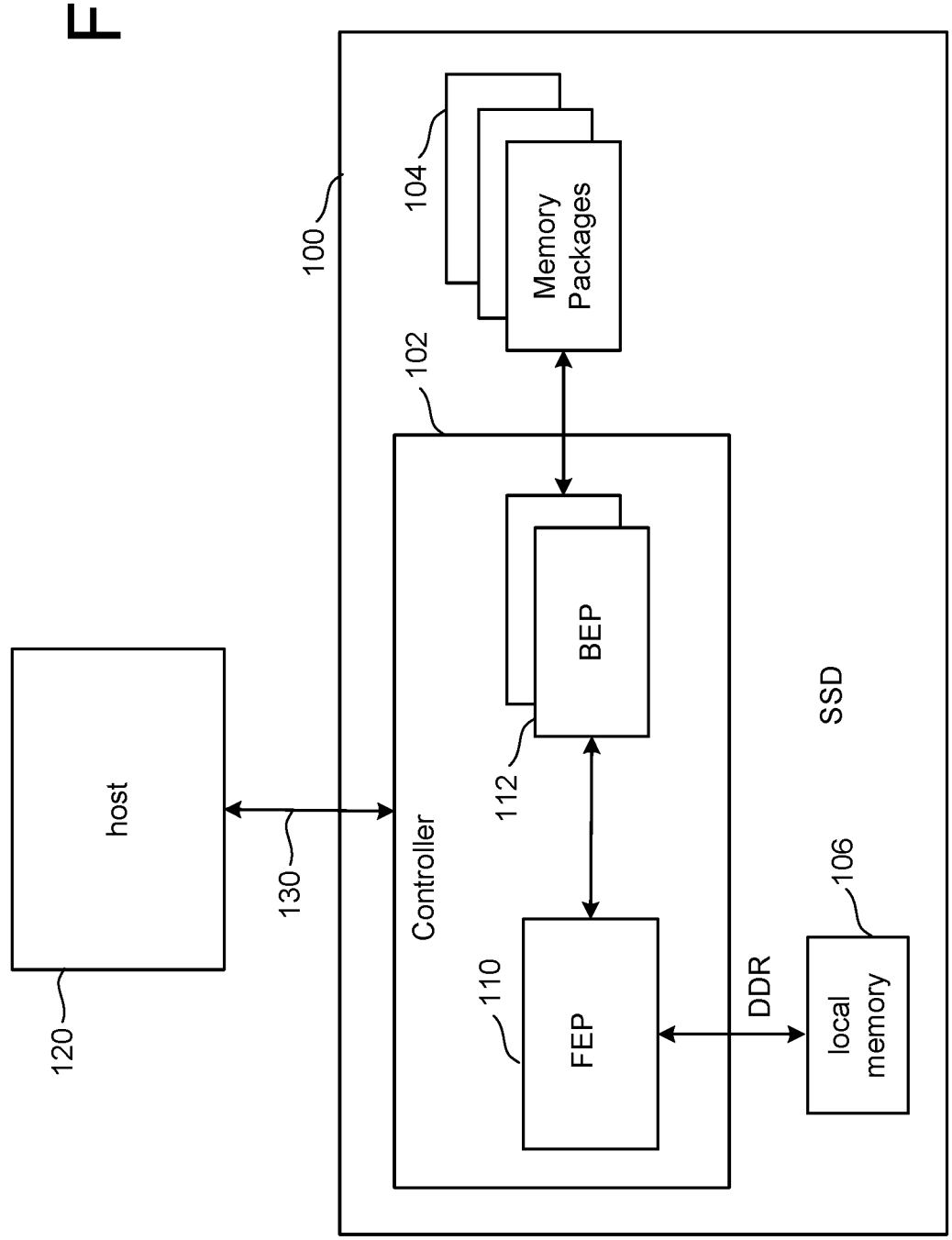
FIG. 1A is a block diagram of one embodiment of a memory device connected to a host.
Figure 1B:
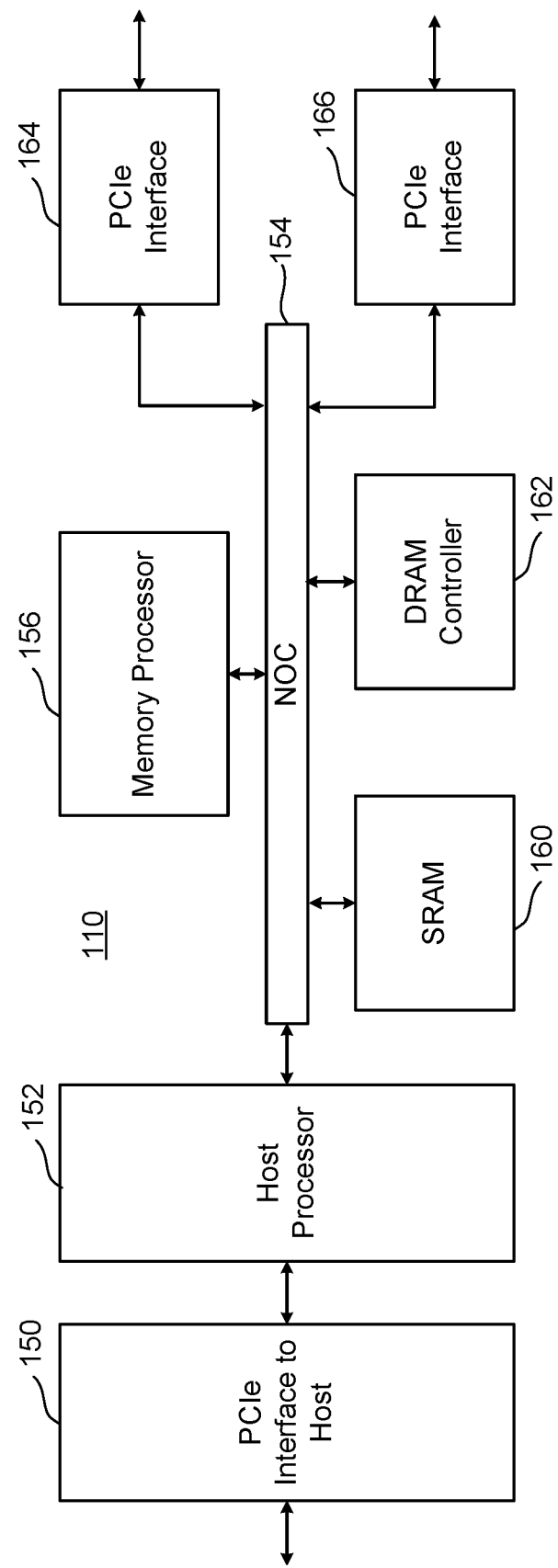
FIG. 1B is a block diagram of one embodiment of a Front End Processor Circuit. In some embodiments, the Front End Processor Circuit is part of a controller.
Figure 1C:
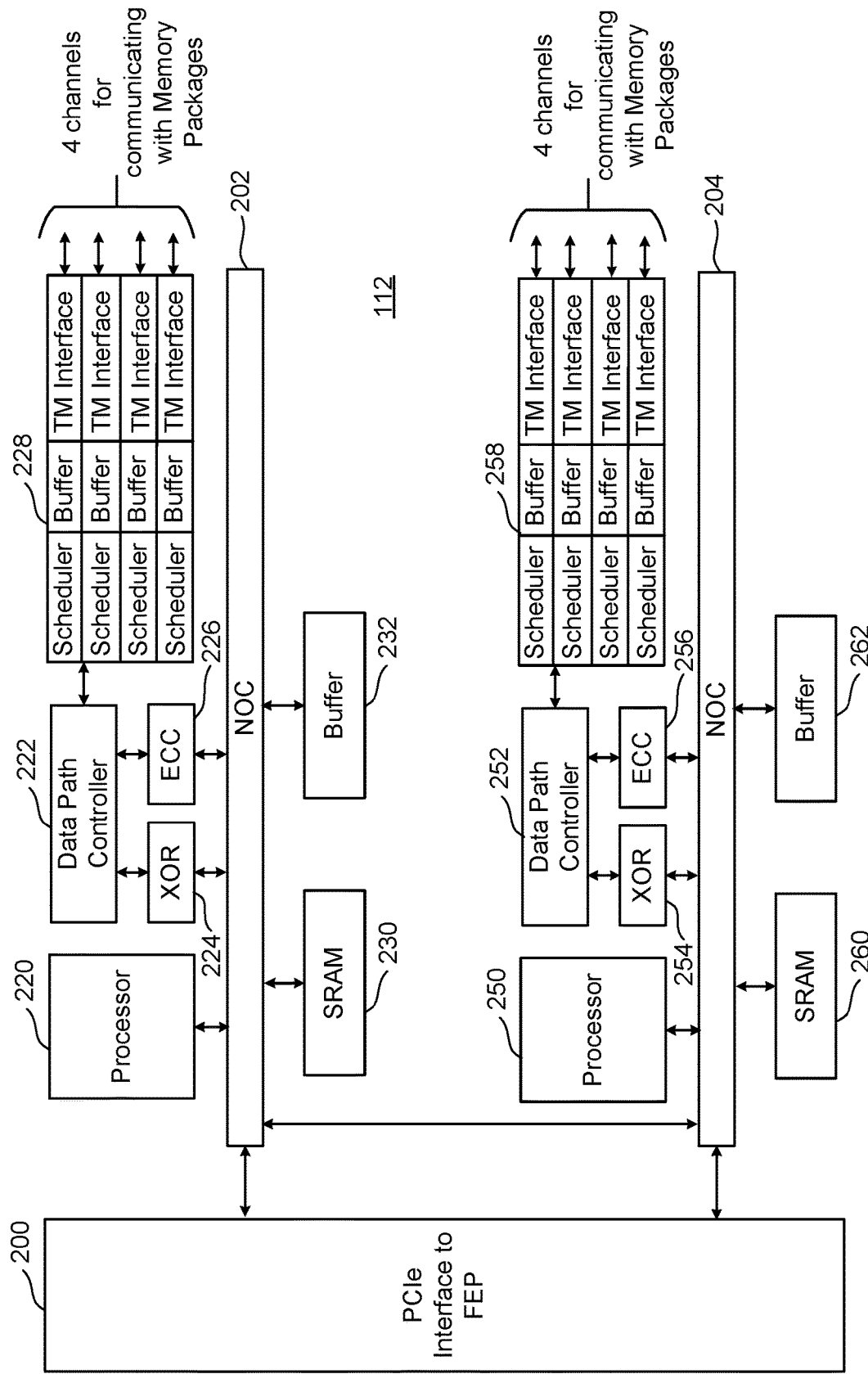
FIG. 1C is a block diagram of one embodiment of a Back End Processor Circuit.
Figure 1D:
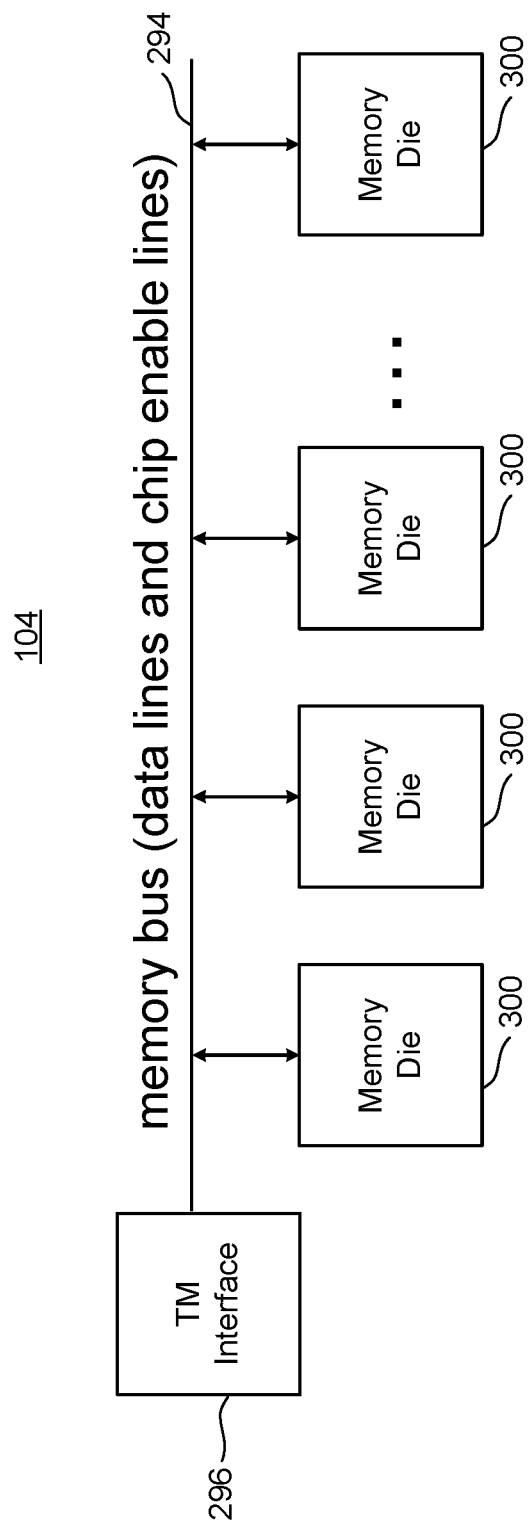

FIG. 1D is a block diagram of one embodiment of a memory package.

Figure 2:
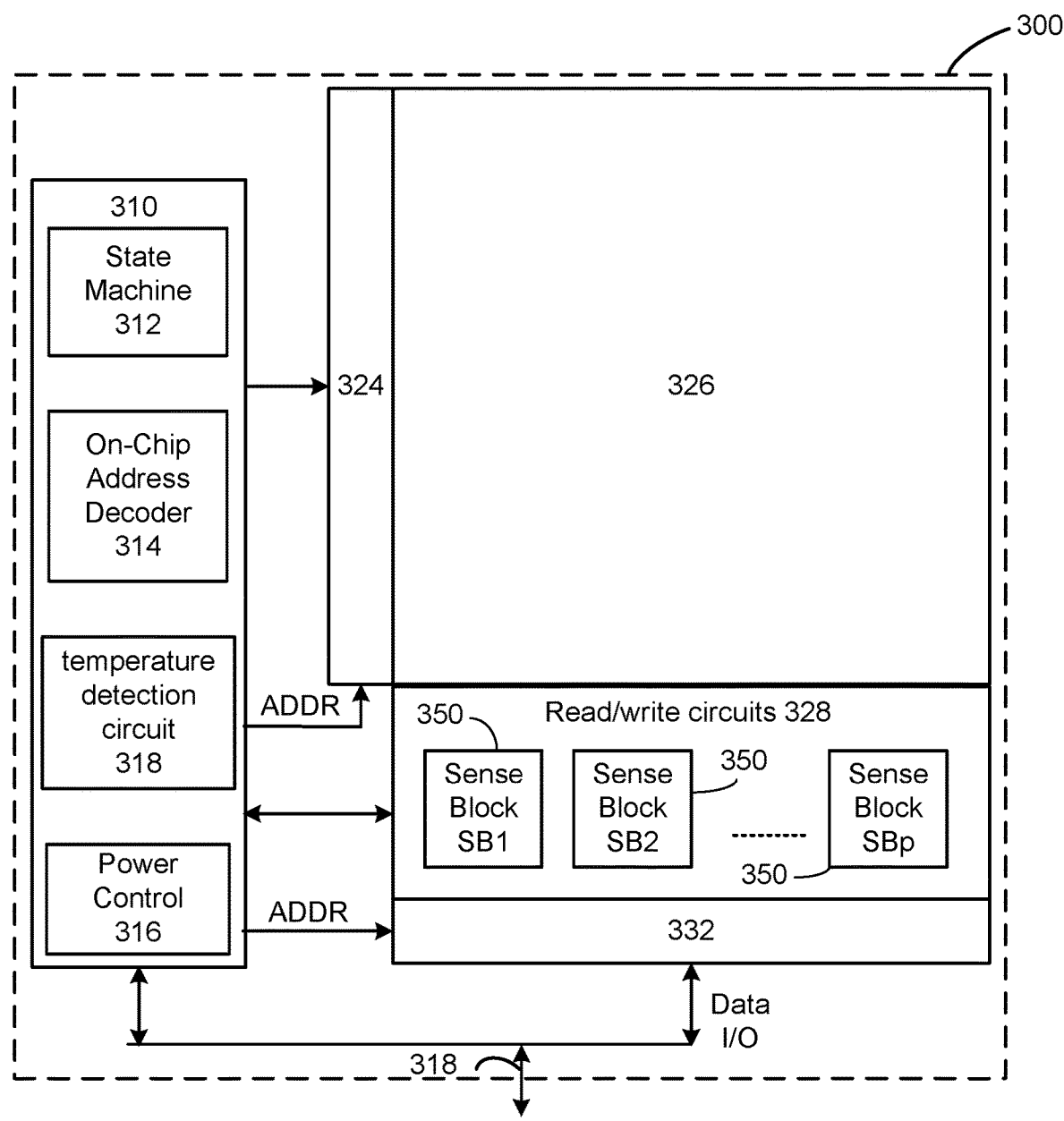

FIG. 2 is a block diagram of one embodiment of a memory die.

FIG. 3 is a block diagram of the memory system, showing the contents of the local memory and the non-volatile memory.

FIG. 4 is a flow chart describing one embodiment of a process for writing data to a non-volatile memory system.

FIGS. 5A-G depict the two blocks in a non-volatile memory system during a write process.

Figure 6:
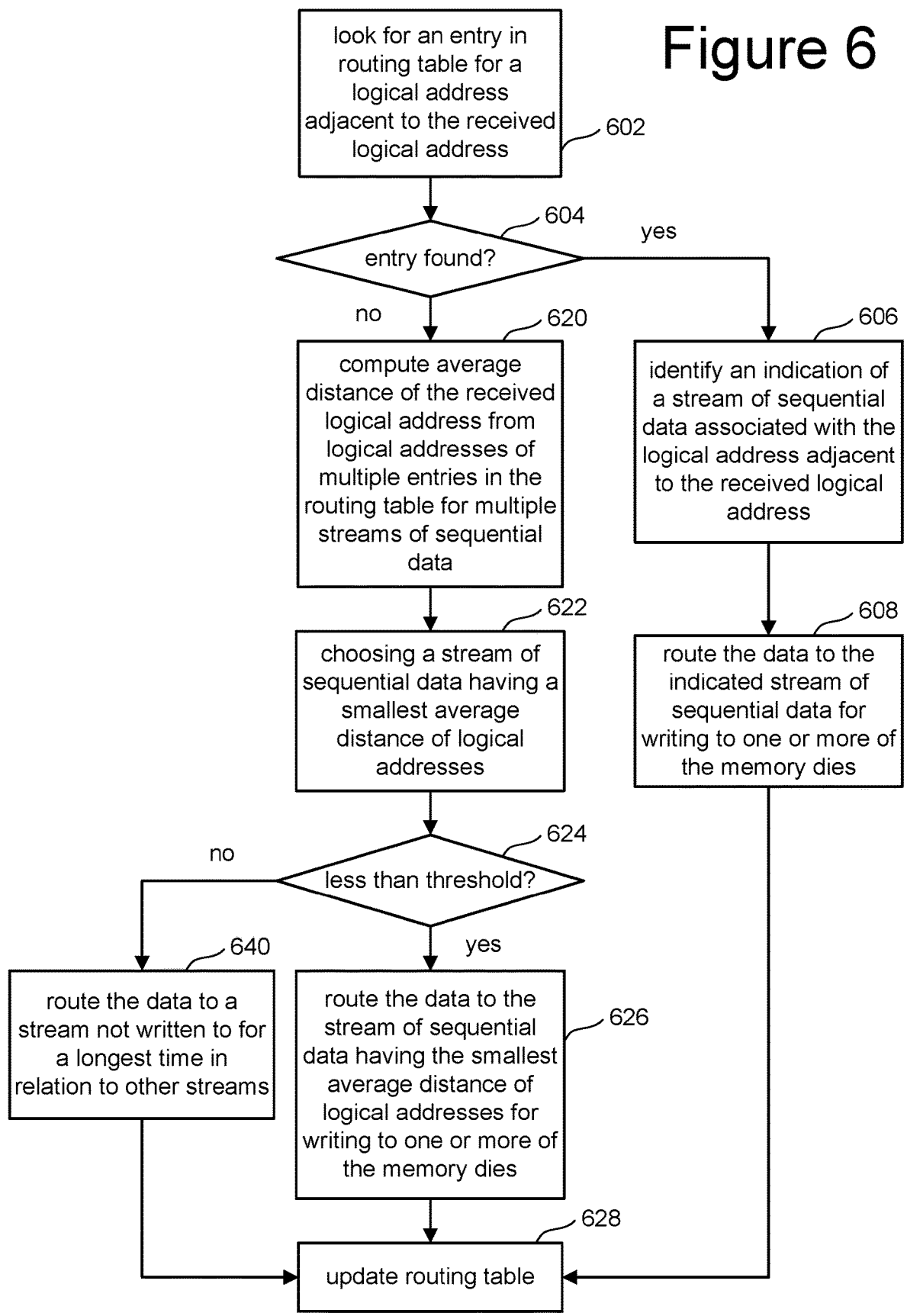

FIG. 6 is a flow chart describing one embodiment of a process for automatically choosing a stream for writing data to one or more memory dies.

FIGS. 7A and 7B are examples of routing tables.

FIG. 8A is a flow chart describing one embodiment of a process performed when storing data in the one or more memory dies.

Figure 8B:
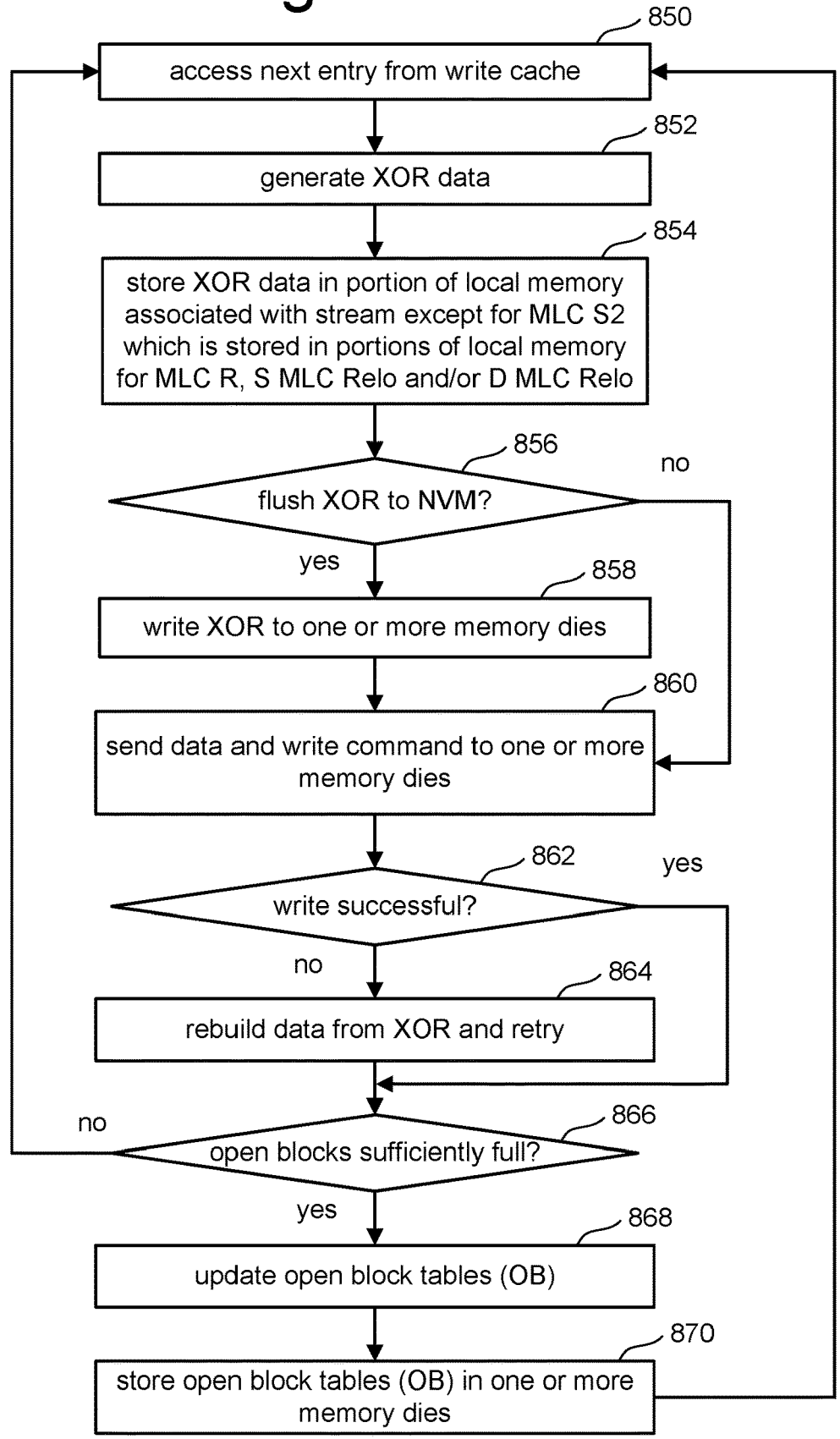

FIG. 8B is a flow chart describing one embodiment of a process performed when storing data in the one or more memory dies.

Figure 9A:
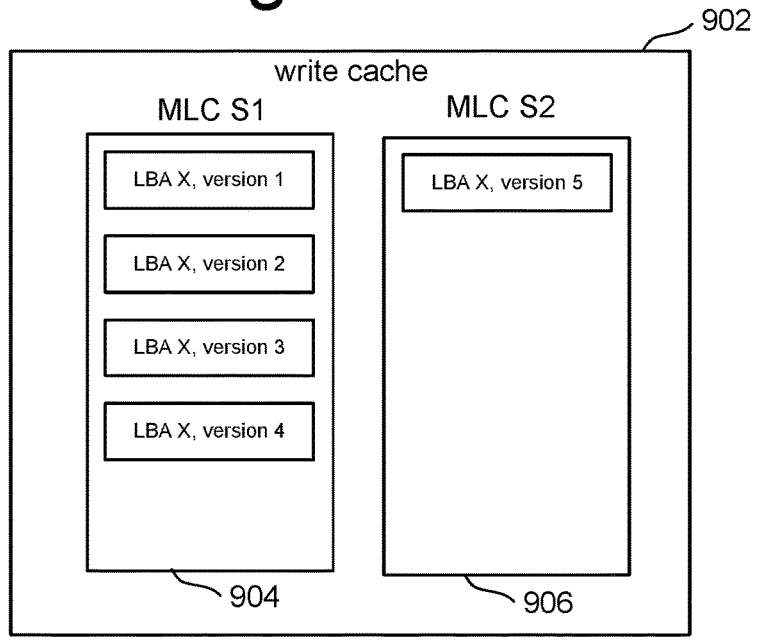

FIG. 9A depicts an example of the contents of a write cache.

Figure 9B:
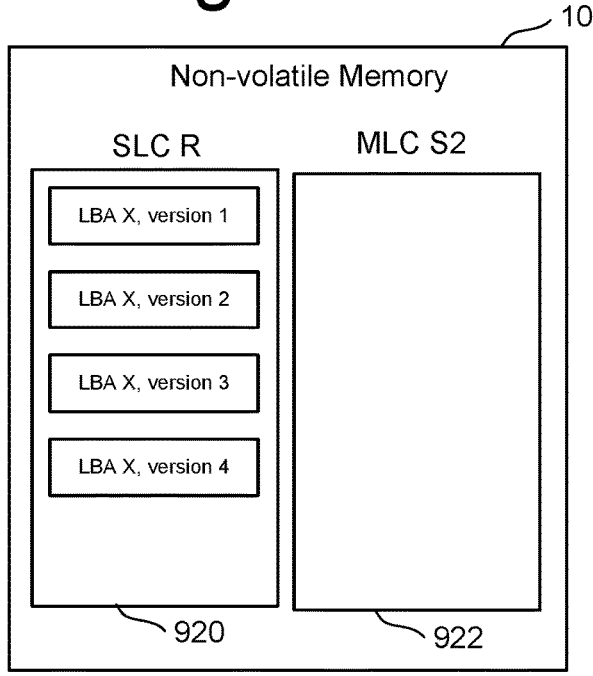

FIG. 9B depicts an example of two blocks in the one or more memory dies.

Figure 9C:
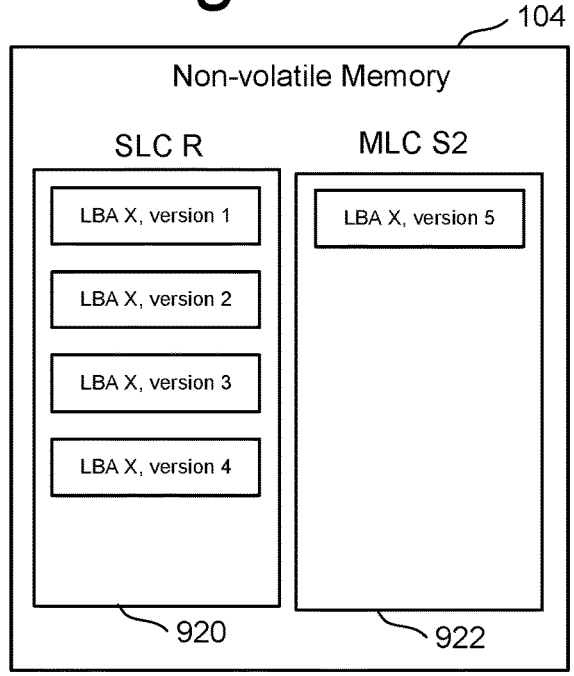

FIG. 9C depicts an example of two blocks in the one or more memory dies.

Figure 10:
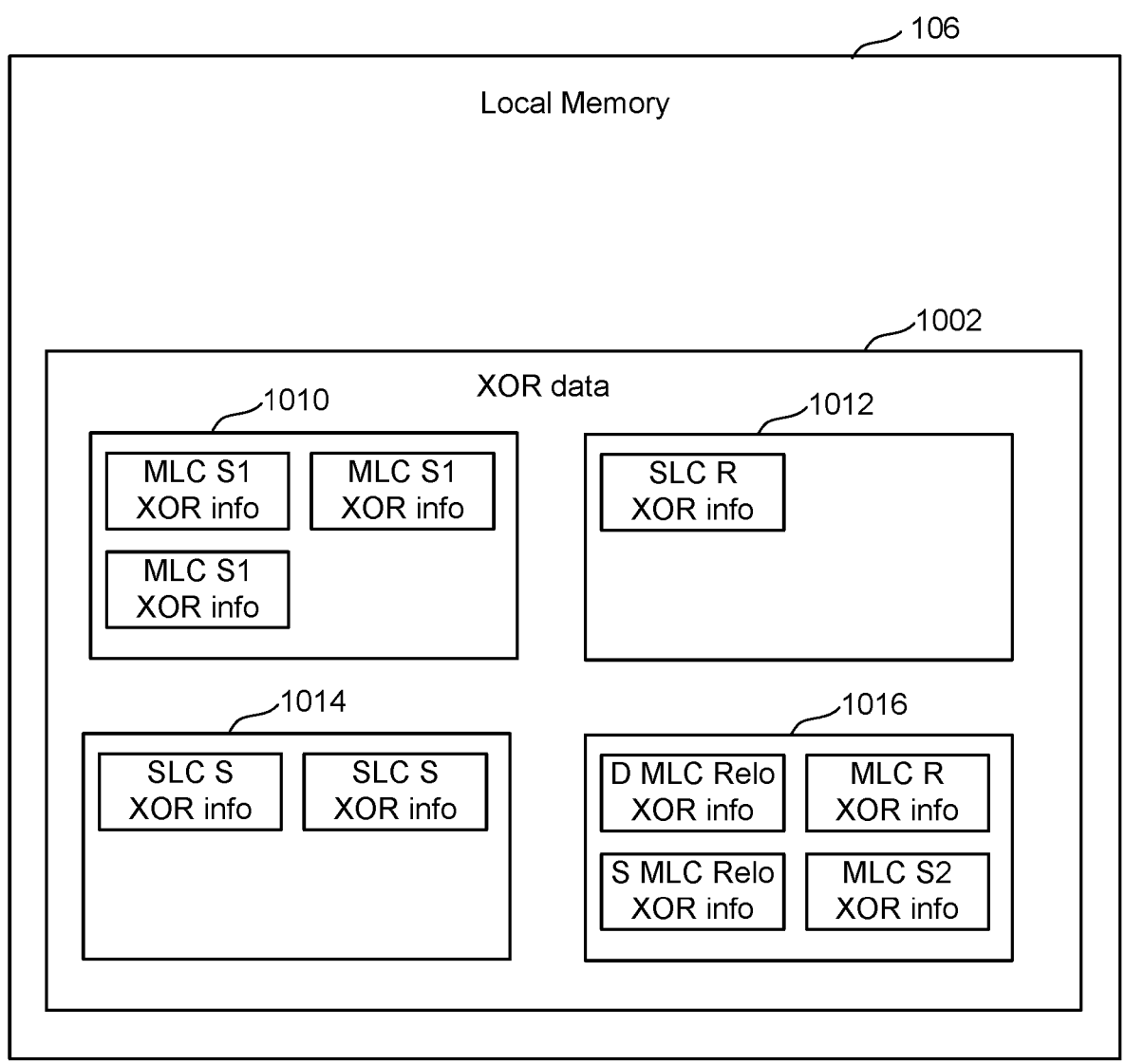

FIG. 10 depicts an example of the contents of the controller's local memory.

Figure 11A:
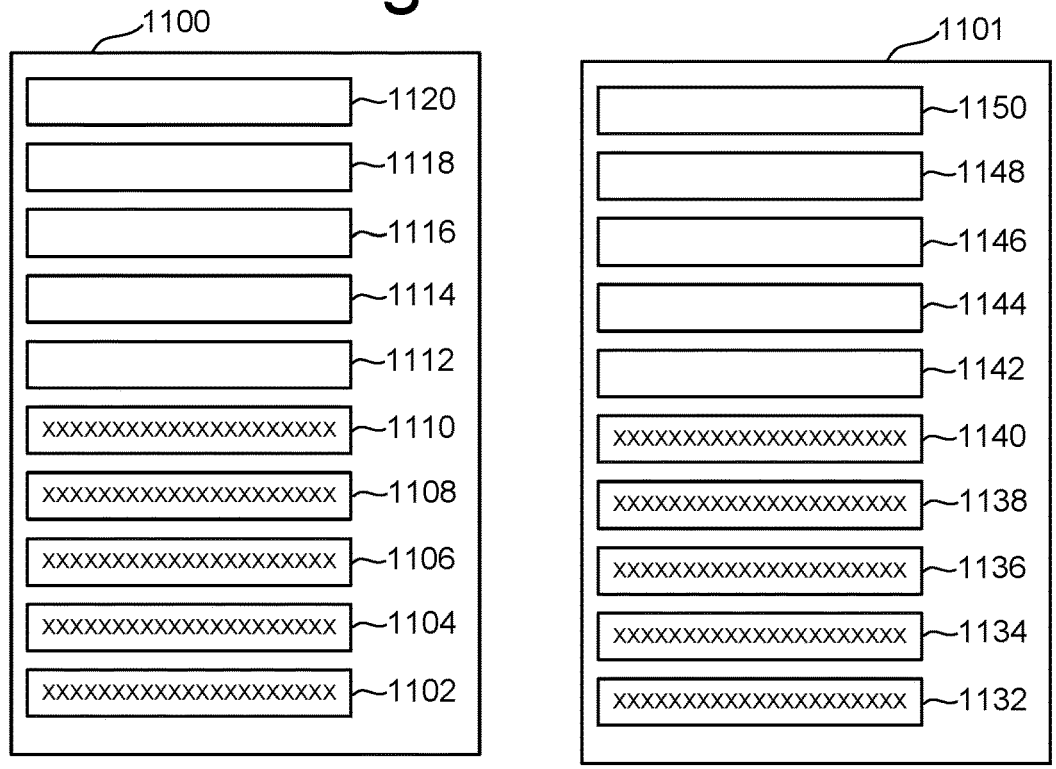

FIG. 11A depicts an example of two blocks in the one or more memory dies.

Figure 11B:
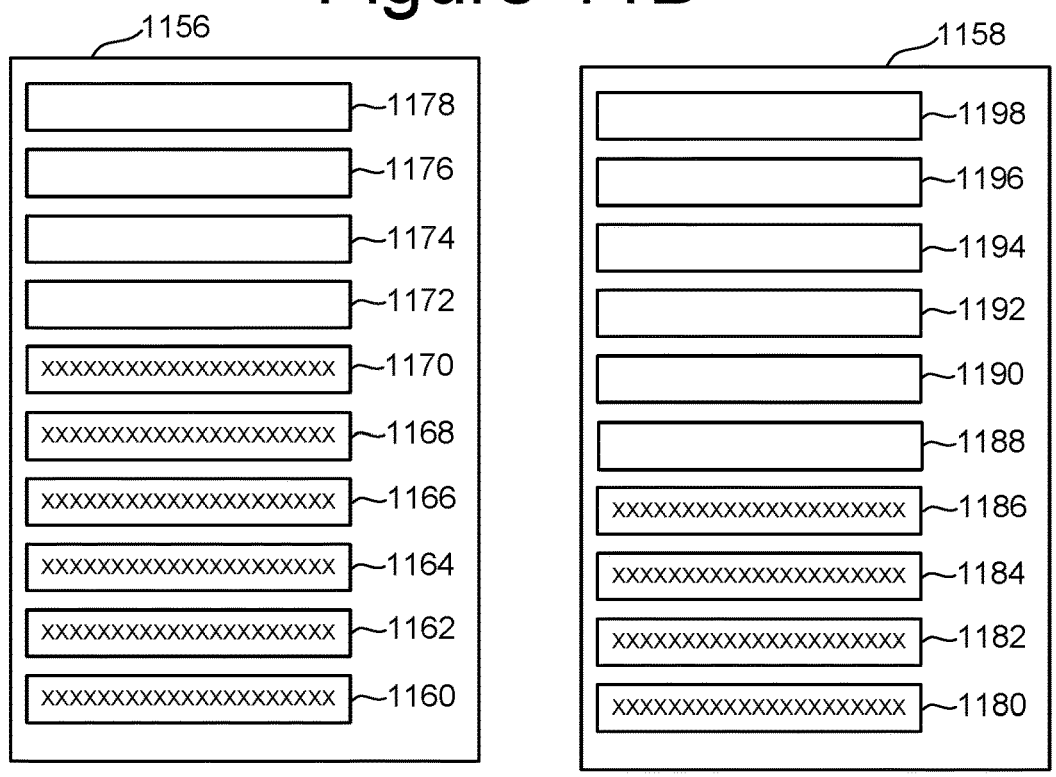

FIG. 11B depicts an example of two blocks in the one or more memory dies.

DETAILED DESCRIPTION

One example of a use for non-volatile memory is to store video from a video camera or other source. Due to the adoption of high resolution video formats, the amount of data that needs to be stored for a video stream is very large. Additionally, to hedge against data loss during the transmission and/or storage processes, some video sources (e.g., video camera or other host) will send video data and error correction data. In some embodiments, the error correction data can be used to recover lost data. There are many schemes known in the art for creating and using error correction data, all of which are applicable. Note that the error correction data can also be referred to as metadata.

In some cases, video camera (or other host) will create the error correction data and initially store the error correction data in the non-volatile memory. After the video camera (or other host) confirms that the video data has been successfully stored in the non-volatile memory, the error correction data can be discarded. However, most semiconductor based non-volatile memory (e.g., flash memory) can only be erased in units of blocks, and cannot randomly erase units of data smaller than blocks. Thus, error correction data to be discarded is marked as invalid (e.g. using a table or flag in the memory or controller). The invalid error correction data is typically mixed with valid video data; thereby, causing the memory system to be fragmented and to fill up faster. To address the condition of a fragmented memory that is close to being filled up, memory systems typically have garbage collection processes that reclaim the memory occupied by invalid data by re-writing and compacting the valid data to a new location (without re-writing the invalid data) and then erasing the block so it is free to store new data.

While a garbage collection process will address the fragmenting of the memory, the memory will be unavailable to store data from a video camera (or other host) while the memory system is performing the garbage collection. This means that a video camera shooting a long video may temporarily have to pause the video, which is not desirable.

To address the above-described performance issue, an additional data stream and storage area is proposed for a memory system, which will result in more compact storage of data and higher write performance. For example, one data stream can be used for the video data and a second data stream can be used for the error correction data. In this manner, when the error correction data is invalidated, the valid video data will not be fragmented and a garbage collection process is will not be needed.

One embodiment of a non-volatile storage apparatus (e.g., an SSD, embedded memory, memory card, etc.) that uses the additional data stream comprises non-volatile memory (e.g., one or more memory dies) connected to a control circuit (e.g., controller, state machine, microcontroller, etc.). The non-volatile memory is configured to have multiple regions for storing different types of data using separate streams. The control circuit is configured to receive a request to write data to a logical address, automatically choose a stream (and corresponding destination region) by determining which of the multiple regions/streams has a sequence of logical addresses associated with previous writes that best fits the logical address for the received data, and store the received data in the chosen destination region of the non-volatile memory using the chosen stream.

FIG. 1A is a block diagram of one embodiment of a memory device 100 connected to a host 120 that can implement the technology proposed herein. Many different types of memory devices can be used with the technology proposed herein. One example memory device is a solid state drive ("SSD"); however, other types of memory devices can also be used. Memory device 100 comprises a controller 102, non-volatile memory 104 for storing data, and local memory 106 (e.g. DRAM. SRAM or ReRAM). In one embodiment, controller 102 comprises a Front End Processor (FEP) circuit 110 and one or more Back End Processor (BEP) circuits 112. In one embodiment FEP circuit 110 is implemented on an ASIC. In one embodiment, each BEP circuit 112 is implemented on a separate ASIC. In one embodiment, the ASICs for each of the BEP circuits 112 and the FEP circuit 110 are implemented on the same semiconductor such that the controller 102 is manufactured as a System on a Chip ("SoC"). FEP circuit 110 and BEP circuit 112 both include their own processors. In one embodiment, FEP circuit 110 and BEP circuit 112 work as a master slave configuration where the FEP circuit 110 is the master and each BEP circuit 112 is a slave. For example, FEP circuit 110 implements a flash translation layer that performs memory management (e.g., garbage collection, wear leveling, etc.), logical to physical address translation, communication with the host, management of DRAM (local memory) and management of the overall operation of the SSD (or other non-volatile storage system). BEP circuit 112 manages memory operations in the memory packages/die at the request of FEP circuit 110. For example, the BEP circuit 112 can carry out the read, erase and programming processes. Additionally, the BEP circuit 112 can perform buffer management, set specific voltage levels required by the FEP circuit 110, perform error correction (e.g., generate error correction code (ECC)), control the Toggle Mode interfaces to the memory packages, etc. In one embodiment, each BEP circuit 112 is responsible for its own set of memory packages. Controller 102 is one example of a control circuit.

In one embodiment, non-volatile memory 104 comprises a plurality of memory packages. Each memory package includes one or more memory die. Therefore, controller 102 is connected to one or more non-volatile memory die. In one embodiment, each memory die in the memory packages 104 utilize NAND flash memory (including two dimensional NAND flash memory and/or three dimensional NAND flash memory). In other embodiments, the memory package can include other types of memory.

Host 120 is one example of an entity that is external to memory device 100. For example, host 120 can be a computer, video camera, still camera, audio recorder, smart appliance, etc. that has memory device 100 embedded therein, or otherwise connected to memory system 100. Other examples of an entity that is external to memory device 100 include other computing devices (e.g., computers, servers, smart appliances, smart phones, etc.) that are connected to memory device 100 and other computing systems that are in communication with memory device 100 via any communication means (e.g., LAN, WAN, WiFi, wired connection, wireless connection, direct connection, indirect connection, etc.). Controller 102 communicates with host 120 via an interface 130 that implements NVM Express (NVMe) over PCI Express (PCIe). In one embodiment, memory system implements the CFexpress standard.

FIG. 1B is a block diagram of one embodiment of FEP circuit 110. FIG. 1B shows a PCIe interface 150 to communicate with host 120 and a host processor 152 in communication with that PCIe interface. The host processor 152 can be any type of processor known in the art that is suitable for the implementation. Host processor 152 is in communication with a network-on-chip (NOC) 154. A NOC is a communication subsystem on an integrated circuit, typically between cores in a SoC. NOCs can span synchronous and asynchronous clock domains or use unclocked asynchronous logic. NOC technology applies networking theory and methods to on-chip communications and brings notable improvements over conventional bus and crossbar interconnections. NOC improves the scalability of SoCs and the power efficiency of complex SoCs compared to other designs. The wires and the links of the NOC are shared by many signals. A high level of parallelism is achieved because all links in the NOC can operate simultaneously on different data packets. Therefore, as the complexity of integrated subsystems keep growing, a NOC provides enhanced performance (such as throughput) and scalability in comparison with previous communication architectures (e.g., dedicated point-to-point signal wires, shared buses, or segmented buses with bridges). Connected to and in communication with NOC 154 is memory processor 156, SRAM 160 and DRAM controller 162. The DRAM controller 162 is used to operate and communicate with the DRAM (e.g., local memory 106). SRAM 160 is local RAM memory used by memory processor 156. Memory processor 156 is used to run the FEP circuit and perform the various memory operations. Also in communication with the NOC are two PCIe Interfaces 164 and 166. In the embodiment of FIG. 1B, the SSD controller will include two BEP circuits 112; therefore there are two PCIe Interfaces 164/166. Each PCIe Interface communicates with one of the BEP circuits 112. In other embodiments, there can be more or less than two BEP circuits 112; therefore, there can be more than two PCIe Interfaces.

FIG. 1C is a block diagram of one embodiment of the BEP circuit 112. FIG. 1C shows a PCIe Interface 200 for communicating with the FEP circuit 110 (e.g., communicating with one of PCIe Interfaces 164 and 166 of FIG. 2). PCIe Interface 200 is in communication with two NOCs 202 and 204. In one embodiment the two NOCs can be combined to one large NOC. Each NOC (202/204) is connected to SRAM (230/260), a buffer (232/262), processor (220/250), and a data path controller (222/252) via an XOR engine (224/254) and an ECC engine (226/256). The ECC engines 226/256 are used to perform error correction, as known in the art (e.g., encoding data to be written and decoding data that is read). The XOR engines 224/254 are used to XOR the write data with previous data written to a block with data written to other memory dies so that the write data can be combined and stored in a manner that can be recovered in case there is a programming error. In one example, the XOR data is stored in DRAM 106 or in one of the memory die in the memory system. After the programming operation is complete, in order to verify that the programming operation was successful, the memory system may read the data page(s) that were programmed and/or data surrounding the newly programmed pages. If any of these read operations fail, the system may perform one or more XOR operations (or other logical/mathematical operations) on the stored combined data with the regions not currently programmed, thus recovering a safe copy of the original data to be programmed. The system may then locate a free region of memory on which to program the saved (recovered) copy.

Data path controller 22 is connected to an interface module for communicating via four channels with memory packages. Thus, the top NOC 202 is associated with an interface 228 for four channels for communicating with memory packages and the bottom NOC 204 is associated with an interface 258 for four additional channels for communicating with memory packages. Each interface 228/258 includes four Toggle Mode interfaces (TM Interface), four buffers and four schedulers. There is one scheduler, buffer and TM Interface for each of the channels. The processor can be any standard processor known in the art. The data path controllers 222/252 can be a processor, FPGA, microprocessor or other type of controller. The XOR engines 224/254 and ECC engines 226/256 are dedicated hardware circuits, known as hardware accelerators. In other embodiments, the XOR engines 224/254 and ECC engines 226/256 can be implemented in software. The scheduler, buffer, and TM Interfaces are hardware circuits.

FIG. 1D is a block diagram of one embodiment of a memory package 104 that includes a plurality of memory die 300 connected to a memory bus (command lines, data lines and chip enable lines) 294. The memory bus 294 connects to a Toggle Mode Interface 296 for communicating with the TM Interface of a BEP circuit 112 (see e.g. FIG. 1C). In some embodiments, the memory package can include a small controller connected to the memory bus and the TM Interface. The memory package can have one or more memory die. In one embodiment, each memory package includes eight or sixteen memory die; however, other numbers of memory die can also be implemented. The technology described herein is not limited to any particular number of memory die.

FIGS. 1A-D provide one example architecture of a controller. However, the technology described herein is not limited to any specific form of the controller. Therefore, other architectures can be utilized for the controller. For example, other embodiments of a controller include microprocessors, microcontrollers, state machine, etc. in other configurations. In some cases, the controller can be inside the host. In other cases, the controller can be implemented on the memory die. Other options/configurations can also be used. A controller can also be referred to as a processor, even if it includes multiple processing cores, as the controller operates as a processor for the memory device.

FIG. 2 is a functional block diagram of one embodiment of a memory die 300. Each of the one or more memory die 130 of FIG. 1D can be implemented as memory die 300 of FIG. 2. The components depicted in FIG. 2 are electrical circuits. In one embodiment, each memory die 300 includes a memory structure 326, control circuitry 310, and read/write circuits 328, all of which are electrical circuits. Memory structure 326 is addressable by word lines via a row decoder 324 and by bit lines via a column decoder 332. The read/write circuits 328 include multiple sense blocks 350 including SB1, SB2, . . . , SBp (sensing circuitry) and allow a page (or multiple pages) of data in multiple memory cells to be read or programmed in parallel. In one embodiment, each sense block include a sense amplifier and a set of latches connected to the bit line. The latches store data to be written and/or data that has been read. The sense blocks include bit line drivers.

Commands and data are transferred between the controller 102 and the memory die 300 via memory die interface 318. Examples of memory die interface 318 include a Toggle Mode Interface and an Open NAND Flash Interface (ONFI). Other I/O interfaces can also be used. Toggle mode (e.g., Toggle Mode 2.0 JEDEC Standard or Toggle Mode 800) is an asynchronous memory interface that supports SDR and DDR with a DQS signal acting as a data strobe signal. Table 1 provides a definition of one example of a Toggle Mode Interface that can be used to implement memory die interface 318.

TABLE 1

| Signal Name | Type | Function |
|---|---|---|
| ALE | Input | Address Latch Enable controls the activating path for addresses to the internal address registers. Addresses are latched on the rising edge of WEn with ALE high. |
| CEn | | Chip Enable controls memory die selection. |
| CLE | Input | Command Latch Enable controls the activating path for commands sent to the command register. When active high, commands are latched into the command register through the I/O ports on the rising edge of the WEn signal. |
| RE | Input | Read Enable Complement |
| REn | Input | Read Enable controls serial data out, and when active, drives the data onto the I/O bus. |
| WEn | Input | Write Enable controls writes to the I/O port. Commands and addresses are latched on the rising edge of the WEn pulse. |
| WPn | Input | Write Protect provides inadvertent program/erase protection during power transitions. The internal high voltage generator is reset when the WPn pin is active low. |
| DQS | Input/Output | Data Strobe acts as an output when reading data, and as an input when writing data. DQS is edge-aligned with data read; it is center-aligned with data written. |
| DQSn | Input/Output | Data Strobe complement (used for DDR) |
| Bus[0:7] | Input/Output | Data Input/Output (I/O) signal bus inputs commands, addresses, and data, and outputs data during Read operations. The I/O pins float to High-z when the chip is deselected or when outputs are disabled. |
| R/Bn | Output | Ready/Busy indicates device operation status. R/Bn is an open-drain output and does not float to High-z when the chip is deselected or when outputs are disabled. When |

TABLE 1-continued

| Signal Name | Type | Function |
|---|---|---|
| | | low, it indicates that a program, erase, or random read operation is in process; it goes high upon completion. |
| ZQ | Supply | Reference for ZQ calibration. |
| VCC | Supply | Power supply for memory die. |
| VCCQ | Supply | I/O power for I/O signals |
| VPP | Supply | Optional, high voltage, external power supply |
| VREF | Supply | Reference voltage, reserved fir Toggle Mode DDR2 |
| VSS | Supply | Ground |

Control circuitry 310 cooperates with the read/write circuits 328 to perform memory operations (e.g., write, read, erase, and others) on memory structure 326. In one embodiment, control circuitry 310 includes a state machine 312, an on-chip address decoder 314, a power control circuit 316 and a temperature detection circuit 318. State machine 312 provides die-level control of memory operations. In one embodiment, state machine 312 is programmable by software. In other embodiments, state machine 312 does not use software and is completely implemented in hardware (e.g., electrical circuits). In some embodiments, state machine 312 can be replaced or augmented by a microcontroller or microprocessor. In one embodiment, control circuitry 310 includes buffers such as registers, ROM fuses and other storage devices for storing default values such as base voltages and other parameters.

The on-chip address decoder 314 provides an address interface between addresses used by controller 120 to the hardware address used by the decoders 324 and 332. Power control module 316 controls the power and voltages supplied to the word lines and bit lines during memory operations. Power control module 316 may include charge pumps for creating voltages.

For purposes of this document, control circuitry 310, alone or in combination with read/write circuits 328 and decoders 324/332, comprise a control circuit connected to memory structure 326. This control circuit is an electrical circuit that performs the functions described below in the flow charts. In other embodiments, the control circuit can consist only of controller 102, which is an electrical circuit in combination with software (e.g., firmware), that performs the functions described below in the flow charts. In another alternative, the control circuit comprises controller 102 and control circuitry 310 performing the functions described below in the flow charts. In another embodiment, the control circuit comprises state machine 312 (and/or a microcontroller and/or microprocessor) alone or in combination with controller 102. In another alternative, the control circuit comprises controller 102, control circuitry 310, read/write circuits 328 and decoders 324/332 performing the functions described below in the flow charts. In other embodiments, the control circuit comprises one or more electrical circuits that operate non-volatile memory.

In one embodiment, memory structure 326 comprises a monolithic three dimensional memory array of non-volatile memory cells in which multiple memory levels are formed above a single substrate. The memory structure may comprise any type of non-volatile memory that is monolithically formed in one or more physical levels of arrays of memory cells having an active area disposed above a silicon (or other type of) substrate. In one example, the non-volatile memory cells of memory structure 326 comprise vertical NAND strings with charge-trapping material such as described, for example, in U.S. Pat. No. 9,721,662, incorporated herein by reference in its entirety. In another embodiment, memory structure 326 comprises a two dimensional memory array of non-volatile memory cells. In one example, the non-volatile memory cells are NAND flash memory cells utilizing floating gates such as described, for example, in U.S. Pat. No. 9,082,502, incorporated herein by reference in its entirety. Other types of memory cells (e.g., NOR-type flash memory) can also be used.

The exact type of memory array architecture or memory cell included in memory structure 326 is not limited to the examples above. Many different types of memory array architectures or memory cell technologies can be used to form memory structure 326. No particular non-volatile memory technology is required for purposes of the new claimed embodiments proposed herein. Other examples of suitable technologies for memory cells of the memory structure 326 include ReRAM memories, magnetoresistive memory (e.g., MRAM, Spin Transfer Torque MRAM, Spin Orbit Torque MRAM), phase change memory (e.g., PCM), and the like. Examples of suitable technologies for architectures of memory structure 326 include two dimensional arrays, three dimensional arrays, cross-point arrays, stacked two dimensional arrays, vertical bit line arrays, and the like.

One example of a ReRAM, or PCMRAM, cross point memory includes reversible resistance-switching elements arranged in cross point arrays accessed by X lines and Y lines (e.g., word lines and bit lines). In another embodiment, the memory cells may include conductive bridge memory elements. A conductive bridge memory element may also be referred to as a programmable metallization cell. A conductive bridge memory element may be used as a state change element based on the physical relocation of ions within a solid electrolyte. In some cases, a conductive bridge memory element may include two solid metal electrodes, one relatively inert (e.g., tungsten) and the other electrochemically active (e.g., silver or copper), with a thin film of the solid electrolyte between the two electrodes. As temperature increases, the mobility of the ions also increases causing the programming threshold for the conductive bridge memory cell to decrease. Thus, the conductive bridge memory element may have a wide range of programming thresholds over temperature.

Magnetoresistive memory (MRAM) stores data by magnetic storage elements. The elements are formed from two ferromagnetic plates, each of which can hold a magnetization, separated by a thin insulating layer. One of the two plates is a permanent magnet set to a particular polarity; the other plate's magnetization can be changed. A memory device is built from a grid of such memory cells. In one embodiment for programming, each memory cell lies between a pair of write lines arranged at right angles to each other, parallel to the cell, one above and one below the cell. When current is passed through them, an induced magnetic field is created.

Phase change memory (PCM) exploits the unique behavior of chalcogenide glass. One embodiment uses a $Ge_2Sb_2Te_5$ alloy to achieve phase changes by electrically heating the phase change material. The doses of programming are electrical pulses of different amplitude and/or length resulting in different resistance values of the phase change material.

A person of ordinary skill in the art will recognize that the technology described herein is not limited to a single specific memory structure, but covers many relevant memory structures within the spirit and scope of the technology as described herein and as understood by one of ordinary skill in the art.

The basic unit of storage in memory structure 326 is a memory cell. In some embodiments, memory cells store one bit of data and are referred to as Single Level Cells ("SLC"). In other embodiments, memory cells store multiple bits of data and are referred to as Multi Level Cells ("MLC"). MLC memory cells can store two bits of data per memory cell, three bits of data per memory cell, four bits of data per memory cell, etc.

In one embodiment, memory structure 326 is a NAND flash memory array. organized in terms of blocks, and each block is further divided into a fixed number of pages. A block is the basic unit for erase operations, while reads and writes are processed in the unit of one page. An example block size of an SLC NAND flash memory is 128 KB. If the MLC memory cell stores three bits of data per memory cell, then an example block size is 384 KB. The typical page size is 2 KB. But these sizes are only example sizes, and the technology described herein is not limited to any block or page size. In many embodiments, a page or block cannot be overwritten unless it is first erased. Some memory systems use "super blocks" that are the aggregate of multiple physical bocks on multiple memory dies.

As discussed above, an additional data stream and storage area is proposed for the memory system, which will result in more compact storage of data and higher write performance. FIG. 3 is a block diagram that depicts controller 102 connected to non-volatile memory 104 and local memory 106. FIG. 3 graphically illustrates the different types of blocks (e.g., for different types of data) that are created and streams implemented in a memory system.

The following types of open blocks are created to store the different types of data:
  SLC Random—small amounts of data written to random addresses in blocks of SLC memory cells;
  SLC Sequential—large amounts of data written to sequential addresses in blocks of SLC memory cells;
  MLC Random—small amounts of data written to random addresses in blocks of MLC memory cells;
  MLC Sequential Stream 1—large amounts of data written to sequential addresses in blocks of MLC memory cells;
  Static MLC Relocation—blocks of MLC memory cells used to perform wear levelling;
  Dynamic MLC Relocation—blocks of MLC memory cells used to perform garbage collection; and
  XOR—blocks of MLC memory cells used to store the XOR parity information of open blocks.

The seven types of blocks/data listed above are found in typical prior art memory systems. The proposed memory system, however, includes an eighth type of block: MLC Sequential Stream 2, for storing data written to sequential addresses in blocks of MLC memory cells, where the type of data written to MLC Sequential Stream 2 blocks is different than the type of data written to MLC Sequential Stream 1 blocks. In one embodiment, for example, video data (data that represents a video signal), as well as other host/user data, can be written to MLC Sequential Stream 1 blocks and error correction data (or other metadata) for the video (or other host/user data) is written to MLC Sequential Stream 2 blocks. In other embodiments, other types of data can be written to MLC Sequential Stream 1 blocks and MLC Sequential Stream 2 blocks.

FIG. 3 shows non-volatile memory 104 having region SLC R comprising blocks of memory cells for storing SLC Random data, region SLC S comprising blocks of memory cells for storing SLC Sequential data, region MLC R comprising blocks of memory cells for storing MLC Random data, region MLC S1 comprising blocks of memory cells for storing MLC Sequential Stream 1 data, region MLC S2 comprising blocks of memory cells for storing MLC Sequential Stream 2 data, region S MLC Relo comprising blocks of memory cells for storing Static MLC Relocation data, region D MLC Relo comprising blocks of memory cells for storing Dynamic MLC Relocation data, and region XOR comprising blocks of memory cells for storing XOR data. For any of the eight regions depicted in non-volatile memory 104 of FIG. 3, the blocks of that regions can be located contiguously in a single memory die or can be spread out (not contiguous) on one or multiple memory die. Thus, one embodiment includes each region having multiple erase blocks of memory cells that are on physically different memory dies.

FIG. 3 depicts controller 102 implementing eight streams (S0-S7) for communicating data to be written (write data) to non-volatile memory 104. For example, stream S0 is for communicating SLC Random data to non-volatile memory 104 for storage in region SLC R, stream S1 is for communicating SLC Sequential data to non-volatile memory 104 for storage in region SLC S, stream S2 is for communicating MLC Random data to non-volatile memory 104 for storage in region MLC R, stream S3 is for communicating MLC Sequential Stream 1 data to non-volatile memory 104 for storage in region MLC S1, stream S4 is for communicating MLC Sequential Stream 2 data to non-volatile memory 104 for storage in region MLC S2, stream S5 is for communicating Static MLC Relocation data to non-volatile memory 104 for storage in region S MLC Relo, stream S6 is for communicating Dynamic MLC Relocation data to non-volatile memory 104 for storage in region D MLC Relo, and stream S7 is for communicating XOR data to non-volatile memory 104 for storage in region XOR.

FIG. 3 shows local memory 106 storing logical to the physical address tables (L2P), tables of open blocks (OB), table of free blocks (FB), XOR data (X), the write cache (WC), and routing tables (RT). Tables of open blocks (OB) identify open blocks, which are blocks of memory cells that have been allocated for writing, have some data stored and have room to store more data. A block includes multiple word lines. An open block has data written to memory cells connected to a first subset of word lines, with no data written to memory cells connected to a second subset of word lines for the block. A block becomes a closed block when the block has been filled with data such that no more data will be programmed to that block. In one embodiment, there is a separate table of open blocks for each type of data. In one embodiment, the tables of open blocks (OB) indicate which word lines are programmed. The table of free blocks (FB) identifies blocks that have not been allocated and are available to be allocated for use to store data. The XOR data (X) store data (e.g., parity information) for reconstructing data that failed programming. The write cache (WC) is used to temporarily store data that needs to be written to non-volatile memory 104. When data is received from host 102 by controller 102, that data is first stored in the write cache (WC). A separate process is used by controller 102 to write the data from the write cache (WC) to non-volatile memory 104. Routing tables (RT) are utilized by controller 102 to document which stream of S0-S7 was used for prior write processes and to choose which stream of S0-S7 to route write data to for a current write process.

Non-volatile memory 104 is addressed internally to the storage system using physical addresses associated with the one or more memory die. However, host 120 will use logical addresses to address the various memory locations. This enables the host to assign data to consecutive logical addresses, while the storage system is free to store the data as it wishes among the physical locations of the one or more memory die. To implement this system, controller 102 performs address translation between the logical addresses used by host 120 and the physical addresses used by the memory die 300 of the non-volatile memory 104. One example implementation is to maintain tables that identify the current translation between logical addresses and physical addresses. These tables are often referred to as L2P tables (see L2P of FIG. 3). An entry in the L2P table may include an identification of a logical address and a corresponding physical address. Although logical address to physical address tables (or L2P tables) include the word "tables" they need not literally be tables. Rather, the logical address to physical address tables (or L2P tables) can be any type of data structure. In some examples, the memory space of a storage system is so large that the local memory 106 cannot hold all of the L2P tables. In such a case, the entire set of L2P tables are stored in non-volatile memory 104 and a subset of the L2P tables are cached in the local high speed volatile memory 106.

FIG. 4 is a flow chart describing one embodiment of a process performed by the system of FIG. 3 to write data using the additional stream proposed herein (e.g., stream S4 for communicating MLC Sequential Stream 2 data to non-volatile memory 104 for storage in region MLC S2). In step 450, controller 102 receives a request to write data to one or more received logical addresses. The request is received from host 120. In one embodiment, the one or more logical addresses are referred to as logical block addresses (LBA). In one example embodiment, a LBA is used to address ½ KB of data. In step 452, controller 102 automatically chooses a stream (and destination region) by determining which of the streams (regions) has a sequence of logical address associated with previous writes that best fits the received one or more logical addresses. That is, controller 102 chooses one (or more) of streams S0-S7. In one embodiment this includes host 120 capturing video and storing it in memory device 100, where host 120 sends its data as a single stream of data that includes video data and error correction data (metadata). In this embodiment, step 452 includes controller 102 automatically choosing stream S3 is for communicating video data to non-volatile memory 104 for storage in region MLC S1 and stream S4 is for communicating error correction data (metadata) to non-volatile memory 104 for storage in region MLC S2. More details of how controller 102 chooses a stream will be provided below with respect to FIG. 6.

In step 454 of FIG. 4, controller 102 identifies a free/open block in the destination region (e.g., MLC S1 or MLC S2) and assigns one or more physical addresses for the chosen destination region. In step 456, controller 102 stores the write data of step 450 in the chosen destination region of the non-volatile memory at the one or more physical addresses. More details of how controller 102 stores the data will be provided below with respect to FIGS. 8A and 8B. In step 458, controller 102 updates the various tables stored in local memory 106 (e.g., L2P, OB, FB, X, WC, RT). In other embodiments, all or a portion of the steps of FIG. 4 can be performed by state machine 312 or a microcontroller/processor on the memory die (see FIG. 2) or memory package (see FIG. 1D).

FIGS. 5A-G depict two blocks 502 and 504 in a non-volatile memory 104 during a write process, and illustrate an example of writing multiple sets of data according to FIGS. 3 and 4. Each of FIGS. 5A-G represent the state of blocks 502 and 504 after another iteration of the process of FIG. 4 by the components of FIG. 3. Additionally, FIGS. 5A-G pertain to the embodiment that includes a host 120 capturing video and storing it in memory device 100. Host 120 sends its data as a single stream of data that includes video data and error correction data (metadata), and controller 102 automatically chooses stream S3 for communicating video data to non-volatile memory 104 for storage in region MLC S1 and stream S4 for communicating error correction data (metadata) to non-volatile memory 104 for storage in region MLC S2. Thus, non-volatile memory 1043 is configured to have a first region for storing user/video data and a second region for storing error correction data, and controller 102 chooses whether to store received data in the first region or the second region based on whether the received logical address for a request to write data better matches a sequence of logical addresses of data written to the first region or a sequence of logical addresses of data written to the second region. Although the request to write data from the host includes a logical address, it does not include an explicit indication of whether the data is user/video data or error correction data (metadata), nor does the request to write data from the host include an indication of which stream to assign the data to. In some cases, the host may not even be aware of the different streams, and the concept of different streams is entirely within the memory system 100.

Figure 5A:
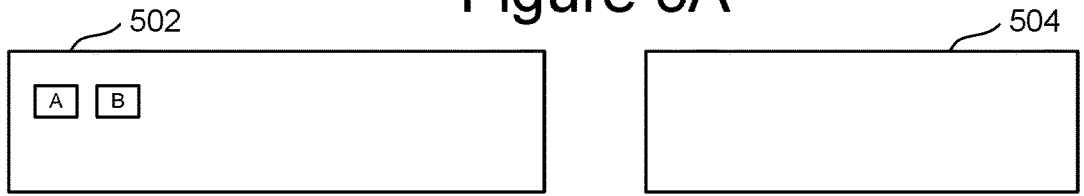

FIG. 5A shows blocks 502 and 504 after host 120 sends data chunk A and data chunk B to controller 102 via interface 130 (step 450), controller 102 chooses stream S3 for communicating the data to non-volatile memory 104 for storage in region MLC S1, and data chunks A/B are stored in block 502 of region MLC S1 in non-volatile memory 104. At this point no data is depicted as being stored in block 504 of region MLC S1 in non-volatile memory 104. In one embodiment, data chunk A represents 4 MB of video data corresponding to LBA's 1-8192 and data chunk B represents 4 MB of video data corresponding to LBA's 8193-16,384. In other embodiments, the data chunks can be different units/amounts of data.

Figure 5B:
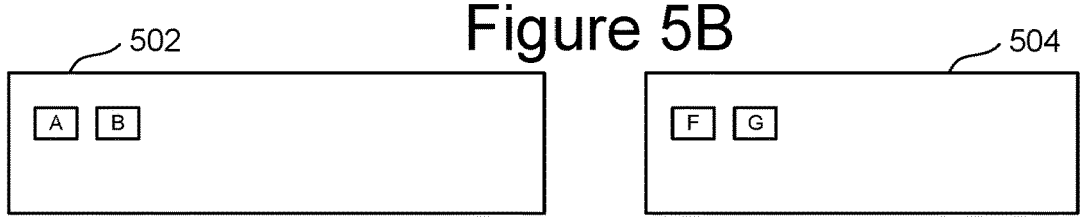

FIG. 5B shows blocks 502 and 504 after host 120 sends data chunk F and data chunk G to the controller 120 via interface 130 (step 450 of next iteration of the process of FIG. 4), controller 102 chooses stream S4 for communicating data for storage in region MLC S2, and data chunks F/G are stored in block 504 of region MLC S2 of non-volatile memory 104. In one embodiment, data chunk F represents 4 MB of error correction data corresponding to LBA's 40,960-49,152 and data chunk G represents 4 MB of error correction data corresponding to LBA's 49,153-57,344. Because these are error correction data, controller 102 performs step 452 to automatically choose stream S4 and store the data in block 504 of region MLC S2 in non-volatile memory 104.

Figure 5C:
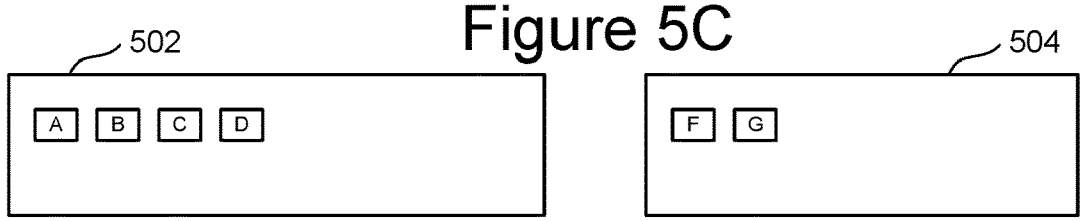

FIG. 5C shows blocks 502 and 504 after host 120 sends data chunk C and data chunk D. Data chunk C represents 4

MB of video data corresponding to LBA's 16,385-24,576 and data chunk D represents 4 MB of video data corresponding to LBA's 24,577-32,768. Upon receiving data chunk C and data chunk D, controller 102 chooses stream S3 in step 452 of FIG. 4 so that data chunk C and data chunk D are stored in block 502 of region MLC S1 in non-volatile memory 104.

Figure 5D:
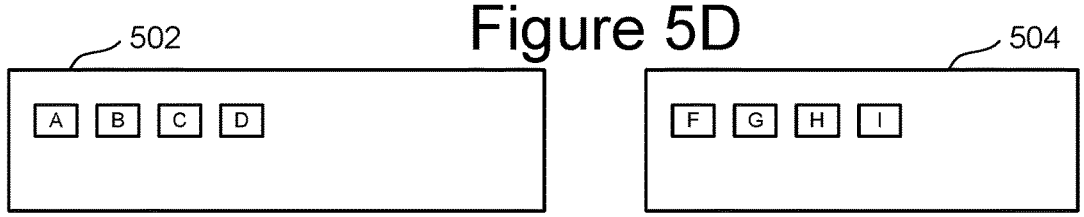

FIG. 5D shows blocks 502 and 504 after host 120 sends data chunk H and data chunk I to the controller 120 via interface 130 (step 450 of next iteration of the process of FIG. 4), controller 102 chooses stream S4 for communicating data for storage in region MLC S2, and data chunks H/I are stored in block 504 of region MLC S2 of non-volatile memory 104. Data chunk H represents 4 MB of error correction data corresponding to LBA's 57,345-65,536. Data chunk I represents 4 MB of error correction data corresponding to LBA's 65,537-73,728. Because these are error correction data, controller 102 performs step 452 to automatically choose stream S4 and store the data in block 504 of region MLC S2 in non-volatile memory 104.

Figure 5E:
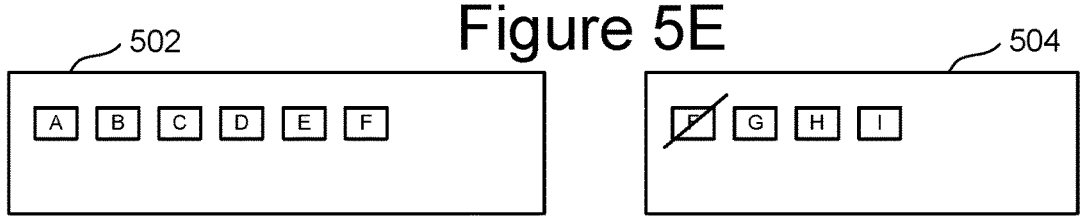

FIG. 5E shows blocks 502 and 504 after host 120 sends data chunk E and data chunk F. Data chunk E represents 4 MB of video data corresponding to LBA's 32,769-40,960. Newly-sent data chunk F now represents 4 MB of video data corresponding to LBA's 40,961-49,152. Thus, the host is telling the memory system to overwrite LBA's 40,960-49,152 with the new video data. Therefore, controller 102 will invalidate data chunk F in block 504, as depicted by the diagonal line through data chunk F of block 504 in FIG. 5E. Upon receiving data chunk E and data chunk F, controller 102 chooses stream S3 in step 452 of FIG. 4 so that data chunk E and data chunk F are stored in block 502 of region MLC S1 in non-volatile memory 104.

Figure 5F:
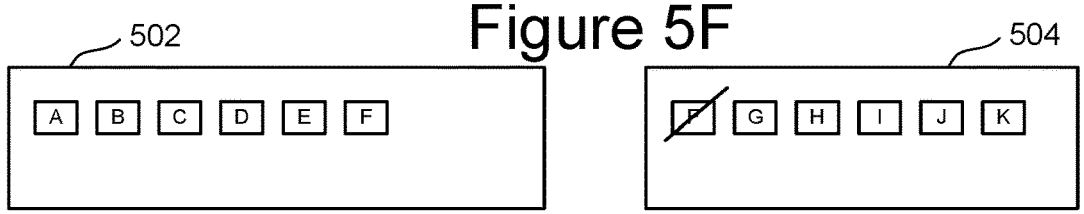

FIG. 5F represents the state of blocks 502 and 504 after controller 102 receives two additional data chunks from host 120. In this case, host 120 sent data chunks J and K. Data chunk J represents 4 MB of error correction data corresponding to LBA's 73,729-81,920. Data chunk K represents 4 MB of error correction data corresponding to LBA's 81,921-90,112. Because these are error correction data, controller 102 performs step 452 to automatically choose stream S4 and store the data in block 504 of region MLC S2 in non-volatile memory 104.

Figure 5G:
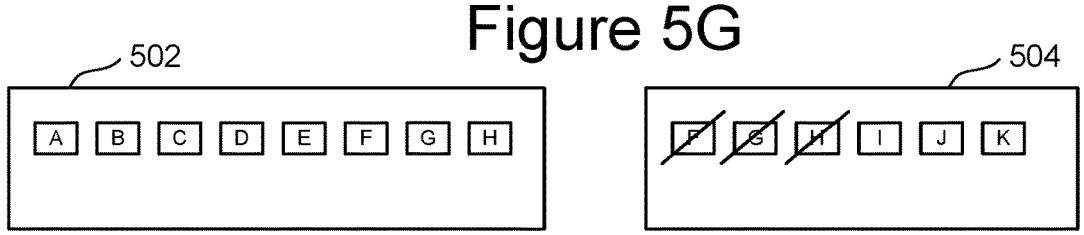

FIG. 5G represents the state of blocks 502 and 504 after receiving the next two data chunks. The new data chunks received from host 120 by controller 102 include new data chunk G and new data chunk H. New data chunk G represents 4 MB of video data corresponding to LBA's 49,153-57,344. New data chunk H corresponds to 4 MB of video data corresponding to LBA's 57,345-65,536. In this case, host 120 is requesting that the memory system overwrite the data stored for LBA's 49,153-65,536 with the new video data. Because the new data is video data, when performing the process of FIG. 4, controller 102 will automatically choose stream S3 (step 452) for communicating the newly received video data to non-volatile memory 104 for storage in block 502 of region MLC S 1. Because the LBA's are being overwritten, block 504 is depicted with data chunk G and data chunk H invalidated (diagonal lines through those data chunks).

FIG. 5A-G show how invalidating the error correction data in block 504 does not fragment block 502. That is, no data needs to be invalidated in block 502; therefore, block 502 is not fragmented. Eventually, if the process continues, all of block 504 will be invalidated; therefore, block 504 can be erased and made available for additional writes. In this manner, garbage collection need not be performed sooner than necessary and write performance will not be degraded. FIGS. 5A-G depict receiving a request to write first data to a first logical address and writing that first data to a first physical address in non-volatile memory that is in the first region of the non-volatile memory reserved for metadata (see data chunk F of FIG. 5B). Additionally, FIGS. 5A-G show receiving a request to write second data to the first logical address and writing that second data to a second physical address in non-volatile memory that is in the second region of the non-volatile memory reserved for user data (see data chunk F of block 502 in FIG. 5E). In this example, when the second data is written using the same logical addresses (40,960-49,152), the first data is invalidated (see diagonal line in block 504 of FIG. 5E). As discussed above, controller 102 translates the logical block addresses to physical addresses in physical block 502 and physical block 504. Therefore, the data for the same LBA's can be written to a first set of physical addresses in block 502 and a second set of physical addresses in block 504. In one embodiment, blocks 502 and 504 are on a single memory die. In other embodiments, blocks 502 and 504 span multiple memory dies.

FIG. 6 is a flow chart describing one embodiment of a process for automatically choosing a stream (a destination region) by determining which of the streams (regions) has a sequence of logical addresses associated with previous writes that best fit the received one or more logical addresses. That is, the process of FIG. 6 provides one example implementation of step 452 of FIG. 4. In one embodiment, the process of FIG. 6 is performed by controller 102. In other embodiments, the process of FIG. 6 can be performed by state machine 312, a microprocessor on memory die 300 or a microcontroller on memory die 300.

The process of FIG. 6 makes use of routing tables (see routing tables RT of FIG. 3). In one embodiment, a routing table indicates a start LBA for a data chunk, and end LBA for a data chunk, the stream that the data chunk was routed to and a time stamp for when the data chunk was received. FIG. 7A and FIG. 7B provide examples of routing tables. The routing table of FIG. 7a includes six entries, each of which is referred to as a patterns; however, it is contemplated that a typical routing table will have many more than six entries (e.g. hundreds or thousands of entries). The first entry (pattern 1) has a start LBA of 101 and end LBA of 300, and was routed to stream 1. The second pattern has a start LBA of 201 and end LBA of 400 and was routed to stream 2. The third pattern has a start LBA of 301 and an end LBA of 500 and was routed to stream S1. The fourth pattern has a start LBA of 401 and an end LBA of 600 and was routed to stream 2. The fifth pattern has a start LBA of 501 and an end LBA of 700, and was routed to stream 1. In the example of FIG. 7A, stream 1 could correspond to stream S3 of FIG. 3 and stream 2 of FIG. 7A can correspond to stream S4 of FIG. 3. Note that in some embodiments, the automatically choosing a stream can choose from among three or more streams, rather than choosing between two streams.

Looking back at FIG. 6, step 602 includes looking for an entry in a routing table having a logical address adjacent to the received logical address. For example, in step 450 of FIG. 4, controller 102 received a request to write data. That request includes one or more received logical addresses. In one embodiment, the lowest logical address of the sequence of logical addresses received in step 450 is used to access the routing table, such as the routing table of FIG. 7A. Controller 102 looks for an end LBA in the routing table that is adjacent to the received logical address. For example, assume that step 450 includes receiving a request to write data to logical block addresses 601-800 (see pattern 6 of FIG. 7A). Thus, in step 602 of FIG. 6, controller 102 looks through the routing table of FIG. 7A for an entry with and END LBA=600. Pattern 4 has an End LBA equal to 600. Thus, the entry is found (step 604) and in step 606 controller 102 identifies an indication of a stream of sequential data associated with a logical address adjacent to the received logical address. That is, because pattern 4 has the logical address adjacent to the received logical address, controller 102 looks at what stream pattern 4 was routed to. In this case pattern 4 was routed to stream 2. Therefore, in step 608, controller 102 routes the newly received data to stream 2 (the indicated stream of the sequential data from the identified indication in the routing table). After routing the data to the indicated in step 608, which causes non-volatile memory 104 to write the data to the appropriate region, controller 102 updates the routing table RT in step 628 by adding the information for pattern 6 into the table of FIG. 7A.

In the next example, a write request is received to write data to LBA's 901-1100). The routing table is now in the form of FIG. 7B. In step 602, controller 102 looks for an entry in the routing table for a logical address adjacent to the received logical address. That is, controller 102 look for LBA of 900 in the routing table of FIG. 7B. In this case the entry is not found (step 604). Therefore, in step 620, controller 102 will compute the average distance of the received logical address (e.g. 901) from the logical addresses of the multiple entries in the routing table for multiple streams of sequential data. Step 620 includes looking at each entry in the routing table (or the last X entries) and determining the difference in logical block addresses to the end LBA for that entry. For example, the distance to pattern 1 is 600, the distance to pattern 2 is 500, the distance to pattern 3 is 400, the distance to pattern 4 is 300, the distance to pattern 5 is 200, the distance of pattern 6 is 100. Step 620 includes averaging the distances to all the patterns for stream 1 and averaging the distance for all the patterns to stream 2. The average distance for all patterns that were routed to stream 1 is 400. The average distance for patterns routed to stream 2 is 300. Step 622 includes choosing a stream with the sequential data having a smallest average distance of logical addresses. In this case controller 102 chooses stream 2.

In step 624, controller 102 determines whether the chosen stream has an average distance less than the threshold. In one embodiment, the threshold could be equivalent to 1 MB of data which in this example corresponds to 2048 LBA's. Since the average distance of 300 is less than 2048, then step 626 is performed which includes writing the data to the stream with sequential data having the smallest average distance. That is, in this example, step 626 includes writing the data to stream 2. Then, in step 628, the routing table is updated. However, if controller 102 determined that the average distance of the chosen stream is not less than the threshold, then in step 640 controller 102 routes the newly received data to the stream not written to for the longest amount of time in relation to the other streams (which in this case would be stream 1).

FIGS. 8A and 8B are both flowcharts that describe processes performed as part of step 456 of FIG. 4 (storing the data in the chosen destination region). In one embodiment, when data is received at controller 102 (e.g. step 450 of FIG. 4), that data is initially and temporarily stored in a write cache WC for the controller. For example, FIG. 3 shows local memory 106 including write cache WC. In one embodiment, there is one write cache WC for all data. In another embodiment, there is a separate write cache WC (or separate portion of the write cache) for each stream. As discussed above, it is possible for the host to send multiple chunks of data for the same logical block address. That is, the host can send data for a logical block address and then send a revision of that data for the same logical block address. Thus, the write cache could have multiple versions of data for the same logical block address. Additionally, as discussed above, data to the same logical address can be routed to different streams. If there are multiple versions of data stored in the write cache, it is possible that a newer version of the data can be committed to one stream while previous versions of the data for another stream are still in the write cache. Eventually when the controller gets to writing the data from the write cache for the other stream, the older version can be written which would cause invalidation of the newer version of the data to the same LBA. To solve this problem, in one embodiment, controller 102 will flush the cache every time the stream is switched. But because it may not be able to flush the cache to the appropriate stream, the data will be flushed to the SLC random stream (e.g. stream S0 of FIG. 3.) as that stream is not likely to be used when receiving a sequence of data such as video data. This process is illustrated in FIG. 8A.

In step 802 of FIG. 8A, controller 102 accesses data to be written. This data is accessed from the write cache WC (see FIG. 3). In step 804, controller 102 accesses the routing table (see FIGS. 7A and/or 7B) in order to determine whether the accessed data to be written is being routed to the same stream as the most immediately previously written data. In other words, controller 102 determines whether the stream is being switched or is this data being sent to the same stream as the previous data written. If the stream is not being switched (step 806), then controller 102 will write the data into the non-volatile memory from the cache in step 808. However, if the stream is being switched then in step 810 controller 102 will flush the write cache WC for the previous stream to the SLC random region by writing the data via stream S0. After flushing the cache for the previous stream, then in step 808 the data accessed in step 802 will be written from the cache to the memory. For example, looking back at FIG. 7B, if data pattern 7 is accessed in step 802, then in step 806 it is determined that the stream is not switched since pattern 7 will be written to steam 2 and the previous pattern 6 was also written to stream 2. Therefore step 810 is skipped and the data will be written in step 808. However, when accessing data in step 802 includes accessing pattern 6, in this case the stream is being switched because the previous pattern (pattern 5) was sent to stream 1 while pattern 6 is being sent to stream 2. Therefore, the system will perform step 810 and flush the write cache WC of all entries for stream 1 in step 810 and then subsequently write pattern 6 to stream 2 in step 808.

FIGS. 9A-9C provide another example of the performance of the process of FIG. 8B. FIG. 9A shows write cache 902 (which corresponds to write cache WC of FIG. 3). In this case, write cache 902 includes one portion of the write cache 904 for the stream S3 being written to region MLC S1 and another portion 906 for stream S4 being written to region MLC S2. In this example, region 904 of write cache 902 includes four versions of data all being written to the same LBA X. Additionally, region 906 of write cache 902 includes a fifth version of the data being written to LBA X. In one example, step 802 of FIG. 8A includes accessing version 5 of the data being written to LBA X and steps 804/806 includes determining that the streams will be switched from steam S3 to stream S4; therefore, controller 102 will flush region 904 of write cache 902 in step 810. FIG. 9B shows non-volatile memory 104 after flushing region 904 of write cache 902 in step 810 such that version 1, version 2, version 3 and version 4 of the data being written LBA X are all stored in region SLC R (via stream S0). In some embodiments, version, 1 version 2 and version 3 could be invalidated. FIG. 9C shows non-volatile memory 104 after performing step 808 such that version 5 of the data is written to and stored in region MLC S2 of non-volatile memory 104 (via stream S4).

As described above, FIG. 8B represents another process performed as part of step 456 of FIG. 4. In one embodiment, the process of FIG. 8B is performed instead of the process of FIG. 8A. In another embodiment, the process of FIG. 8B is performed with the process of FIG. 8A. The process of FIG. 8B pertains to managing XOR data (see table X of FIG. 3) and open blocks (see table OB of FIG. 3). As discussed above, controller 102 maintains XOR data in order to reconstruct write data if the writing process fails. Because an additional stream (an additional region) is proposed, then additional area needs to be made available for the XOR data of the additional stream (additional region). However, provisioning space for the new XOR data from space for user data would lower the capacity for the user. Therefore, it is proposed that the XOR data for the new stream be stored in the space allocated for MLC random data, static MLC relocation data, and/or dynamic MLC relocation data. This is accomplished via the process of FIG. 8B.

After memory system 100 experiences an ungraceful shutdown, memory system 100 will power back on and begin operation again. One of the tasks performed when powering back on is to scan the open blocks to determine which word lines have been programmed and which word lines have not been programmed. Unprogrammed word lines will have all memory cells in an erased state. This scanning process will let the memory system reconstitute open block tables OB in local memory 106 so that normal operation can proceed. However, the scanning process takes time to perform. Since it is proposed to add an additional stream and additional regions, there will be additional open blocks. Because there are additional open blocks, the scanning process will take longer. This would cause a delay at startup, which may be unwanted by a user. To reduce this impact at startup, it is proposed that when the blocks are sufficiently full (have reached a threshold amount of data being stored), then open block tables are updated to indicate which word lines are programmed and which word lines are not programmed and that information is then stored in a non-volatile memory. Therefore, if there is an ungraceful shutdown, then upon restart (power-on) the controller 102 can access the open block tables in the non-volatile memory to see which word lines have been programmed and the scanning only needs to be performed on word lines that are not indicated to be programmed by the open block tables. This reduces the time for scanning. This process in enabled by the method depicted in FIG. 8B.

In step 850 of FIG. 8B, controller 102 accesses the next entry in the write cache. In step 852, controller 102 will generate XOR data by XOR'ing the data accessed in step 850 with the previously XOR data generated from previous writes. In step 854, the XOR data is stored in portion of local memory associated with the stream for the write data, except for data to be stored in MLC S2 which is stored in portions of local memory for MLC R, S MLC Relo, and/or D MLC Relo. In some embodiments, the XOR data will be flushed to non-volatile memory in response to certain conditions. The flushing of XOR data to non-volatile memory could happen periodically. In other embodiments the XOR data will be flushed to non-volatile memory when there is a graceful power off. If it is time to flush the XOR data to non-volatile memory (step 856), then in step 858 controller 102 will cause the XOR data to be written to one or more memory dies (from table X in local memory 106—see FIG. 3). If the XOR data is not to be flushed to non-volatile memory (step 856), then the data accessed in 850 is sent to one or more memory dies with a write command so that the data is written to the one or more memory dies. If the write process was successful (step 862), then the process continues at step 866. However, if the write process was not successful then the data is rebuilt from the XOR data in step 864 and the write process is retried. After successfully writing the data, in step 866 controller 102 determines whether the open blocks for each of the streams is sufficiently full. For example in one embodiment, all of the open blocks have to be half full for controller 102 to determine that the open blocks for each of the streams is sufficiently full. In another embodiment, 50% of the total aggregate of the open blocks has to be sufficiently full. Other percentages can also be used. If the open blocks are not sufficiently full, then the process loops back to step 850 and the next data is accessed from the write cache. However, if the open blocks for all of the streams (or at least streams S3 and S4) are sufficiently full, then in step 868 controller 102 will update open blocks tables OB to indicate which word lines are programmed in the open blocks and which word lines are not programmed. In step 870, the open block tables OB are stored in one or more memory dies and the process continues back at step 850.

FIG. 10 provides an example relating to the XOR data described above. FIG. 10 shows local memory 106 storing XOR data 1002. In one embodiment, XOR data 1002 corresponds to XOR data X of FIG. 3. The XOR data in local memory 106 includes a section 1010 storing data to be programmed to region MLC S1 (stream S3); section 1012 storing XOR information from SLC random data to be stored in region SLC R; section 1014 storing XOR information for SLC sequential data (data to be stored in region SLC S); and section 1016 storing MLC random data, static MLC relocation data and dynamic MLC relocation data. However, as discussed, region 1016 will also be used to store data for stream S4 which includes the second stream of data for MLC sequential data to be stored in region MLC S2. Thus, FIG. 8B and FIG. 10 describe an embodiment where the controller is configured to use a first portion of the local memory for storing information to reconstruct data written to an open block of the first stream for sequential data, a second portion of the local memory for storing information to reconstruct data written to an open block of the stream for random data and a third portion of the local memory for storing information to reconstruct data to an open block of the stream for relocation data; and the controller 102 is configured to use at least one of the second portion of the local memory and third portion of the local memory for storing information to reconstruct data written to an open block for stream S4 of sequential data.

FIGS. 11A and 11B depict open blocks, and provide examples of blocks that are sufficiently full (step 866 of FIG. 8B). More specifically, FIG. 11A depicts open blocks 1100 and 1101. Open block 1100 includes word lines 1102, 1104, 1106, 1108, 1110, 1112, 1114, 1116, 1118, and 1120. The memory cells connected to word lines 1102, 1104, 1106, 1108 and 1110 are programmed. The memory cells connected to word lines 1112, 1114, 1116, 1118, and 1120 are not programmed. Because block 1100 includes word lines that have not been subjected to programming, block 1100 is an open block. Block 1101 includes word lines 1132, 1134, 1136, 1138, 1140, 1142, 1144, 1146, 1148 and 1150. Memory cells connected to word lines 1132, 1134, 1136, 1138 and 1140 are programmed. Memory cells connected to word lines 1142, 1144, 1146, 1148 and 1150 are not programmed. Because block 1101 includes word lines that have not been subjected to programming, block 1101 is an open block. In the example of FIG. 11A, both blocks are open blocks that are half programmed. Consider an example where block 1100 stores data from stream S3 and block 1101 stores data from stream S4. Therefore, looking back at FIG. 8B, performing step 866 includes determining that both open blocks 1100 and 1101 are sufficiently full; therefore, the process will proceed to step 868 to update the open block tables OB and store those open block tables OB in non-volatile memory 104.

FIG. 11B shows two open blocks 1156 and 1158. Block 1156 includes word lines 1160, 1162, 1164, 1166, 1168, 1170, 1172, 1174, 1176 and 1178. Memory cells connected to word lines 1160, 1162, 1164, 1166, 1168 and 1170 are programmed. Memory cells connected to word lines 1172. 1174, 1176 and 1178 are not programmed. Block 1158 includes word lines 1180, 1182, 1184, 1186, 1188, 1190, 1192, 1194, 1196 and 1198. Memory cells connected to word lines 1180, 1182, 1184 and 1186 are programmed. Memory cells connected to word lines 1188, 1190, 1192, 1194, 1196 and 1198 are not programmed. In this example, assume that block 1156 is for storing data from stream S3 and block 1158 is for storing data from stream S4. FIG. 11B is an example where the two open blocks are programmed at different levels (neither exactly at 50%), but as aggregate are half programmed such that ten of the twenty word lines for the two blocks are programmed. Therefore, performing step 866 of FIG. 9B will include determining that the open blocks are sufficiently full. Note that blocks 1100, 1101, 1156 and 11158 of FIGS. 11A and 11B are depicted as having ten word liens each; however, ten word lines is only for example purposes. Most blocks in a memory system would have many more than ten word lines (e.g., 48 word lines, 96 word liens, 128 word lines, etc.).

FIGS. 11A and 11B, together with FIG. 8B, describe a controller that is configured to store information in the non-volatile memory of which word lines of an open block for a first stream for sequential data have been programmed and which word lines of an open block for a second stream for sequential data have been programmed in response to a threshold amount of data being programmed into the open block for the first stream for sequential data and the open block for the second stream for sequential data; and the controller is configured to use the information in the non-volatile memory of which word lines of the open block for the first stream for sequential data have been programmed and which word lines of the open block for the second stream for sequential data have been programmed at start-up to determine where new data can be written after start-up (e.g., power-on or reset/restart).

The above discussion introduces an additional data stream and storage area for a memory system, which will result in more compact storage of data and higher write performance. For example, because the data is stored more compactly and with less fragmentation, the write process will not be slowed down by an interruption due to garbage collection.

One embodiment includes a non-volatile storage apparatus comprising non-volatile memory (e.g., one or more memory dies) connected to a control circuit (e.g., controller, state machine, microcontroller, etc.). The non-volatile memory is configured to have multiple regions for storing different types of data using separate streams. The control circuit is configured to receive a request to write first data to a first logical address, automatically choose a destination region of the multiple regions by determining which of the multiple regions has a sequence of logical address associated with previous writes that best fits the first logical address, and store the first data in the chosen destination region of the non-volatile memory.

In one example implementation, the control circuit is configured to write data in a cache prior to writing to the non-volatile memory; the control circuit is configured to communicate multiple streams of data to the non-volatile memory; each stream of data is written to a different region of the multiple regions; a first stream of data is written to a first region; a second stream of data is written to a second region; and the control circuit is configured to flush the cache prior to storing the first data in the chosen destination region if the automatically choosing the destination region causes the control circuitry to switch streams of data.

In one example implementation, the control circuit is configured to communicate multiple streams of data to the non-volatile memory; the multiple streams include a first stream for sequential data, a second stream for sequential data, a stream for random data and a stream for relocation data; the control circuit includes a local memory; the control circuit is configured to use a first portion of the local memory for storing information to reconstruct data written to an open block of the first stream for sequential data, a second portion of the local memory for storing information to reconstruct data written to an open block of the stream for random data, and a third portion of the local memory for storing information to reconstruct data written to an open block of the stream for relocation data; and the control circuit is configured to use at least one of the second portion of the local memory and the third portion of the local memory for storing information to reconstruct data written to an open block of the second stream for sequential data.

In one example implementation, the control circuit is configured to communicate multiple streams of data to the non-volatile memory; each stream of data is written to a different region of the multiple regions; the multiple streams include a first stream for sequential data, a second stream for sequential data, and a stream for random data; the control circuit is configured to store information in the non-volatile memory of which word lines of an open block for the first stream for sequential data have been programmed and which word lines of an open block for the second stream for sequential data have been programmed in response to a threshold amount of data being programmed into the open block for the first stream for sequential data and the open block for the second stream for sequential data; and the control circuit is configured to use the information in the non-volatile memory of which word lines of an open block for the first stream for sequential data have been programmed and which word lines of an open block for the second stream for sequential data have been programmed at start-up to determine where new data can be written after start-up.

One embodiment includes a method for operating non-volatile storage. The method comprises receiving a request to write first data to a first logical address; writing the first data to a first physical address in non-volatile memory that is in a first region of the non-volatile memory reserved for metadata; receiving a request to write second data to the first logical address; and writing the second data to a second physical address in non-volatile memory that is in a second region of the non-volatile memory reserved for user data.

One embodiment includes a non-volatile storage apparatus comprising a plurality of memory dies each including a non-volatile memory structure and a controller connected to the memory dies. The controller and memory dies form a solid state drive. The controller is configured to receive a request to write first data to a first logical address; look for an entry in a routing table for a logical address adjacent to the first logical address; if the logical address adjacent to the first logical address is found in the routing table, identify an indication of a first stream of sequential data associated with the logical address adjacent to the first logical address and route the first data to the first stream of sequential data for writing to one or more of the memory dies; if the logical address adjacent to the first logical address is not found in the routing table, compute average distance of logical addresses from multiple entries in the routing table for multiple streams of sequential data, choose a stream of sequential data having a smallest average distance of logical addresses and route the first data to the stream of sequential data having the smallest average distance of logical addresses for writing to one or more of the memory dies.

For purposes of this document, reference in the specification to "an embodiment," "one embodiment," "some embodiments," or "another embodiment" may be used to describe different embodiments or the same embodiment.

For purposes of this document, a connection may be a direct connection or an indirect connection (e.g., via one or more others parts). In some cases, when an element is referred to as being connected or coupled to another element, the element may be directly connected to the other element or indirectly connected to the other element via intervening elements. When an element is referred to as being directly connected to another element, then there are no intervening elements between the element and the other element. Two devices are "in communication" if they are directly or indirectly connected so that they can communicate electronic signals between them.

For purposes of this document, the term "based on" may be read as "based at least in part on."

For purposes of this document, without additional context, use of numerical terms such as a "first" object, a "second" object, and a "third" object may not imply an ordering of objects, but may instead be used for identification purposes to identify different objects. For example, the terms "first" and "second" in the phrases first data transfer message and second data transfer message are used as identification labels to distinguish the messages and are not meant to indicate an order.

For purposes of this document, the term "set" of objects may refer to a "set" of one or more of the objects.

The foregoing detailed description has been presented for purposes of illustration and description. It is not intended to be exhaustive or to limit to the precise form disclosed. Many modifications and variations are possible in light of the above teaching. The described embodiments were chosen in order to best explain the principles of the proposed technology and its practical application, to thereby enable others skilled in the art to best utilize it in various embodiments and with various modifications as are suited to the particular use contemplated. It is intended that the scope be defined by the claims appended hereto.

What is claimed is:

1. A non-volatile storage apparatus, comprising:
   non-volatile memory, the non-volatile memory is configured to have multiple regions for storing different types of data including a first region for storing user data and a second region for storing error correction data; and
   a control circuit connected to the non-volatile memory, the control circuit is configured to:
   receive a request to write first data to a first logical address,
   automatically choose a destination region of the multiple regions by determining which of the multiple regions has a sequence of logical address associated with previous writes that best fits the first logical address including choosing whether to store the first data in the first region or the second region based on whether the first logical address better matches a sequence of logical addresses of data written to the first region or a sequence of logical addresses of data written to the second region, and
   store the first data in the chosen destination region of the non-volatile memory.

2. The non-volatile storage apparatus of claim 1, wherein:
the control circuit is configured to communicate multiple streams of data to the non-volatile memory;
each stream of data is written to a different region of the multiple regions;
a first stream of data includes MLC sequential user data and is written to the first region; and
a second stream of data includes MLC sequential error correction data and is written to the second region.

3. The non-volatile storage apparatus of claim 2, wherein:
the request to write first data to the first logical address does not include an indication of which stream of data to assign the first data.

4. The non-volatile storage apparatus of claim 1, wherein:
the control circuit is configured to store the first data in the chosen destination region of the non-volatile memory by writing the first data to a first physical address in non-volatile memory that is in the first region of the non-volatile memory which is reserved for user data;
the control circuit is further configured to receive a request to write other data to the first logical address and write the other data to a different physical address in non-volatile memory that is in the second region of the non-volatile memory which is reserved for error correction data; and
the control circuit is configured to invalidate the other data at the different physical address in the non-volatile memory in response to writing the first data to the first physical address in non-volatile memory.

5. The non-volatile storage apparatus of claim 1, wherein:
to automatically choose the destination region, the control circuit is configured to:
   look for an entry in a routing table for a logical address adjacent to the first logical address,
   if the logical address adjacent to the first logical address is found in the routing table, identify an indication of a first stream of sequential data associated with the logical address adjacent to the first logical address and route the first data to the first stream of sequential data for writing to one or more of the memory dies, and
   if the logical address adjacent to the first logical address is not found in the routing table, compute average distance of the first logical address from logical addresses from multiple entries in the routing table for multiple streams of sequential data, choose a stream of sequential data having a smallest average distance of logical addresses and route the first data to the stream of sequential data having the smallest average distance of logical addresses for writing to one or more of the memory dies.

6. The non-volatile storage apparatus of claim 1, wherein:
to automatically choose the destination region, the control circuit is configured to:
  look for an entry in a routing table for a logical address adjacent to the first logical address,
  if the logical address adjacent to the first logical address is found in the routing table, identify an indication of a first stream of sequential data associated with the logical address adjacent to the first logical address and route the first data to the first stream of sequential data for writing to one or more of the memory dies,
  if the logical address adjacent to the first logical address is not found in the routing table, compute average distance of the first logical address from logical addresses from multiple entries in the routing table for multiple streams of sequential data, choose a stream of sequential data having a smallest average distance of logical addresses and route the first data to the stream of sequential data having the smallest average distance of logical addresses for writing to one or more of the memory dies if the smallest average distance is less than a threshold, and
  if the logical address adjacent to the first logical address is not found in the routing table and the smallest average distance is not less than the threshold, route the data to a stream not written to for a longest time in relation to other streams.

7. The non-volatile storage apparatus of claim 1, wherein:
the control circuit includes a local memory;
the local memory is configured to store a routing table;
the routing table is configured to store routing data for multiple previous sequential writes;
the routing data comprises an identification of a stream, a start logical address, a finish logical address and a time stamp; and
the control circuits is configured to determine which of the multiple regions has a sequence of logical address associated with previous writes that best fits the first logical address by comparing the first logical address to finish logical addresses in the routing table.

8. The non-volatile storage apparatus of claim 1, wherein:
the control circuit is configured to write data in a cache prior to writing to the non-volatile memory;
the control circuit is configured to communicate multiple streams of data to the non-volatile memory;
each stream of data is written to a different region of the multiple regions;
a first stream of data is written to the first region;
a second stream of data is written to the second region; and
the control circuit is configured to flush the cache prior to storing the first data in the chosen destination region if the automatically choosing the destination region causes the control circuitry to switch streams of data.

9. The non-volatile storage apparatus of claim 1, wherein:
the control circuit is configured to communicate multiple streams of data to the non-volatile memory;
the multiple streams include a first stream for sequential data, a second stream for sequential data, a stream for random data and a stream for relocation data;
the control circuit includes a local memory;
the control circuit is configured to use a first portion of the local memory for storing information to reconstruct data written to an open block of the first stream for sequential data, a second portion of the local memory for storing information to reconstruct data written to an open block of the stream for random data, and a third portion of the local memory for storing information to reconstruct data written to an open block of the stream for relocation data; and
the control circuit is configured to use at least one of the second portion of the local memory and the third portion of the local memory for storing information to reconstruct data written to an open block of the second stream for sequential data.

10. The non-volatile storage apparatus of claim 1, wherein:
the control circuit is configured to communicate multiple streams of data to the non-volatile memory;
each stream of data is written to a different region of the multiple regions;
the multiple streams include a first stream for sequential data, a second stream for sequential data, and a stream for random data;
the control circuit is configured to store information in the non-volatile memory of which word lines of an open block for the first stream for sequential data have been programmed and which word lines of an open block for the second stream for sequential data have been programmed in response to a threshold amount of data being programmed into the open block for the first stream for sequential data and the open block for the second stream for sequential data; and
the control circuit is configured to use the information in the non-volatile memory of which word lines of the open block for the first stream for sequential data have been programmed and which word lines of the open block for the second stream for sequential data have been programmed at start-up to determine where new data can be written after start-up.

11. The non-volatile storage apparatus of claim 1, wherein:
the control circuit is a controller;
the non-volatile memory comprises multiple memory dies;
the controller and the multiple memory dies comprise a solid state drive;
the solid state drive further comprises a host interface that is configured to connected to an entity external to the solid state drive;
the request to write the first data to the first logical address is received at the controller from the entity external to the solid state drive via the host interface; and
the first region includes multiple erase blocks of memory that are physically in different memory dies.

12. A method for operating non-volatile storage, the method comprising:
receiving a request to write first data to a first logical address;
writing the first data to a first physical address in non-volatile memory that is in a first region of the non-volatile memory reserved for metadata;
receiving a request to write second data to the first logical address; and
writing the second data to a second physical address in non-volatile memory that is in a second region of the non-volatile memory reserved for user data.

13. The method of claim 12, further comprising:
automatically choosing the first region of multiple regions of the non-volatile memory by determining that the first region has a sequence of logical address associated with previous writes that best fits the first logical address as compared to other regions.

14. The method of claim 12, wherein:
the writing the first data to the first physical address in non-volatile memory that is in the first region comprises writing to a first stream of data;
the writing the second data to the second physical address in non-volatile memory that is in the second region comprises switching streams to write data to a second stream of data; and
the method further comprises flushing a write cache in response to the switching streams.

15. The method of claim 12, wherein:
the writing the first data to the first physical address in non-volatile memory that is in the first region comprises writing to a first stream of sequential data;
the writing the second data to the second physical address in non-volatile memory that is in the second region comprises switching streams to write data to a second stream of sequential data; and
the method further comprises storing information to reconstruct data written to an open block of the first stream of sequential data in a portion of volatile memory reserved for storing information to reconstruct data written for an open block of random data.

16. The method of claim 12, wherein:
the writing the first data to the first physical address in non-volatile memory that is in the first region comprises writing to a first stream of sequential data;
the writing the second data to the second physical address in non-volatile memory that is in the second region comprises switching streams to write data to a second stream of sequential data; and
the method further comprises:
storing information in the non-volatile memory of which word lines of an open block for the first stream of sequential data have been programmed and which word lines of an open block for the second stream of sequential data have been programmed in response to a threshold amount of data being programmed into the open block for the first stream of sequential data and the open block for the second stream of sequential data, and
using the information in the non-volatile memory of which word lines of the open block for the first stream of sequential data have been programmed and which word lines of the open block for the second stream of sequential data have been programmed at start-up to determine where new data can be written after start-up.

17. A non-volatile storage apparatus, comprising:
a plurality of memory dies each including a non-volatile memory structure; and
a controller connected to the memory dies, the controller and memory dies form a solid state drive, the controller is configured to:
receive a request to write first data to a first logical address,
look for an entry in a routing table for a logical address adjacent to the first logical address,
if the logical address adjacent to the first logical address is found in the routing table, identify an indication of a first stream of sequential data associated with the logical address adjacent to the first logical address and route the first data to the first stream of sequential data for writing to one or more of the memory dies, and
if the logical address adjacent to the first logical address is not found in the routing table, compute average distance of logical addresses from multiple entries in the routing table for multiple streams of sequential data, choose a stream of sequential data having a smallest average distance of logical addresses and route the first data to the stream of sequential data having the smallest average distance of logical addresses for writing to one or more of the memory dies.

18. The non-volatile storage apparatus of claim 17, wherein:
the first stream of sequential data is for user data being written to the one or more of the memory dies; and
the stream of sequential data having the smallest average distance of logical addresses is for error correction data being written to the one or more of the memory dies.

19. The non-volatile storage apparatus of claim 17, wherein:
the controller is configured to receive a request to write second data to the first logical address, invalidate the first data and route the second data to a different stream than the first data for writing to one or more of the memory dies.

* * * * *